United States Patent
Park et al.

(10) Patent No.: US 11,443,809 B2
(45) Date of Patent: Sep. 13, 2022

(54) MEMORY DEVICE AND METHOD OF OPERATING THE SAME

(71) Applicant: SK hynix Inc., Icheon-si Gyeonggi-do (KR)

(72) Inventors: Tae Hun Park, Icheon-si Gyeonggi-do (KR); Nam Kyeong Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/216,288

(22) Filed: Mar. 29, 2021

(65) Prior Publication Data

US 2022/0101923 A1 Mar. 31, 2022

(30) Foreign Application Priority Data

Sep. 29, 2020 (KR) .......................... 10-2020-0126705

(51) Int. Cl.
| | |
|---|---|
| *G11C 16/04* | (2006.01) |
| *G11C 16/10* | (2006.01) |
| *G11C 11/56* | (2006.01) |
| *G11C 16/34* | (2006.01) |
| *G11C 16/08* | (2006.01) |

(52) U.S. Cl.
CPC .......... *G11C 16/10* (2013.01); *G11C 11/5628* (2013.01); *G11C 11/5671* (2013.01); *G11C 16/0483* (2013.01); *G11C 16/08* (2013.01); *G11C 16/3459* (2013.01)

(58) Field of Classification Search
CPC . G11C 16/10; G11C 11/5628; G11C 11/5671; G11C 16/0483; G11C 16/08; G11C 16/3459
See application file for complete search history.

(56) References Cited

U.S. PATENT DOCUMENTS

| | | | |
|---|---|---|---|
| 2008/0158955 A1* | 7/2008 | Lee ..................... | G11C 16/3454 365/185.03 |
| 2008/0205160 A1* | 8/2008 | Kim .................... | G11C 16/0483 365/185.29 |
| 2011/0103154 A1* | 5/2011 | Cho .................... | G11C 16/3418 365/185.23 |

FOREIGN PATENT DOCUMENTS

| | | |
|---|---|---|
| KR | 1020110048296 A | 5/2011 |
| KR | 1020130006300 A | 1/2013 |

* cited by examiner

*Primary Examiner* — Hien N Nguyen
(74) *Attorney, Agent, or Firm* — William Park & Associates Ltd.

(57) ABSTRACT

Provided is a memory device. The memory device may include a voltage code controller configured to generate a voltage code that generates a program voltage and pass voltages based on a number of times a program loop is performed, and a voltage generator configured to generate the program voltage and the pass voltages in response to the voltage code, transmit the program voltage to a selected word line, and transmit the pass voltages to unselected word lines, wherein the voltage generator is configured to sequentially increase the pass voltage that is applied to the unselected word lines in order of proximity to the selected word line as the number of times a program loop is performed increases.

19 Claims, 20 Drawing Sheets

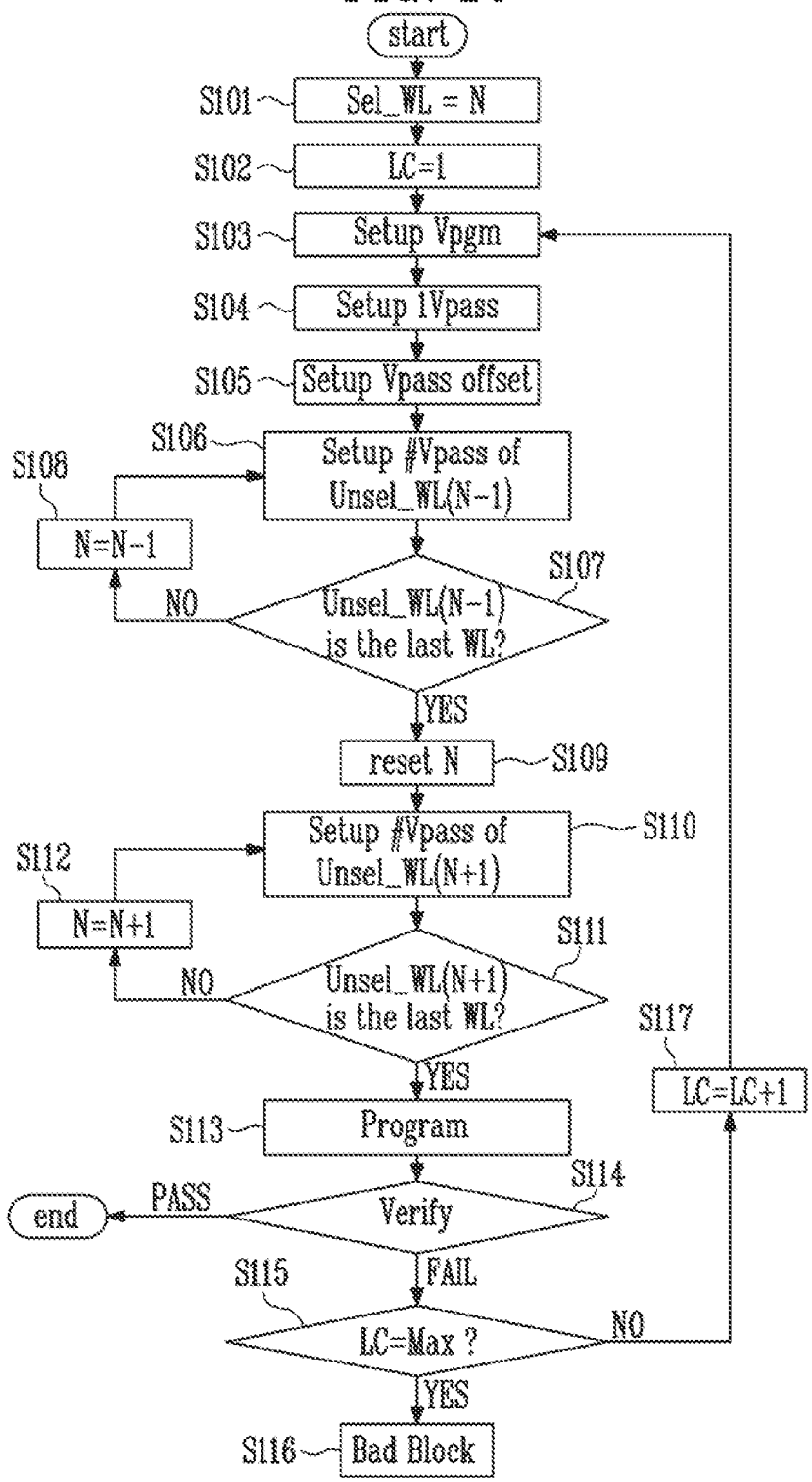

FIG. 11A

| Loop Count (LC) | 1 | 2 | 3 | 4 | 5 | 6 | ... |
|---|---|---|---|---|---|---|---|
| ... | ... | ... | ... | ... | ... | ... | |
| WL(n+5) | 1Vpass | 1Vpass | 1Vpass | 1Vpass | 1Vpass | 2Vpass | ... |
| WL(n+4) | 1Vpass | 1Vpass | 1Vpass | 1Vpass | 2Vpass | 3Vpass | ... |
| WL(n+3) | 1Vpass | 1Vpass | 1Vpass | 2Vpass | 3Vpass | 4Vpass | ... |
| WL(n+2) | 1Vpass | 1Vpass | 2Vpass | 3Vpass | 4Vpass | 5Vpass | ... |
| WL(n+1) | 1Vpass | 2Vpass | 3Vpass | 4Vpass | 5Vpass | 6Vpass | ... |
| WLn | 1Vpgm | 2Vpgm | 3Vpgm | 4Vpgm | 5Vpgm | 6Vpgm | ... |
| WL(n-1) | 1Vpass | 2Vpass | 3Vpass | 4Vpass | 5Vpass | 6Vpass | ... |
| WL(n-2) | 1Vpass | 1Vpass | 2Vpass | 3Vpass | 4Vpass | 5Vpass | ... |
| WL(n-3) | 1Vpass | 1Vpass | 1Vpass | 2Vpass | 3Vpass | 4Vpass | ... |
| WL(n-4) | 1Vpass | 1Vpass | 1Vpass | 1Vpass | 2Vpass | 3Vpass | ... |
| WL(n-5) | 1Vpass | 1Vpass | 1Vpass | 1Vpass | 1Vpass | 2Vpass | ... |
| ... | ... | ... | ... | ... | ... | ... | |

Unsel_WL: WL(n+5)...WL(n+1); Sel_WL: WLn; Unsel_WL: WL(n-1)...WL(n-5)

FIG. 12A (a>b)

| Loop Count (LC) | 1 | 2 | 3 | 4 | 5 | 6 | ... |
|---|---|---|---|---|---|---|---|
| ... | | | | | | | |
| WL(n+5) | 1Vpass | 1Vpass | 1Vpass | 1Vpass | 1Vpass | 1Vpass+Δb | ... |
| WL(n+4) | 1Vpass | 1Vpass | 1Vpass | 1Vpass | 1Vpass+Δb | 1Vpass+Δ2b | ... |
| WL(n+3) | 1Vpass | 1Vpass | 1Vpass | 1Vpass+Δb | 1Vpass+Δ2b | 1Vpass+Δ3b | ... |
| WL(n+2) | 1Vpass | 1Vpass | 1Vpass+Δb | 1Vpass+Δ2a | 1Vpass+Δ3b | 1Vpass+Δ4b | ... |
| WL(n+1) | 1Vpass | 1Vpass+Δa | 1Vpass+Δ2a | 1Vpass+Δ3a | 1Vpass+Δ4a | 1Vpass+Δ5a | ... |
| WLn | 1Vpgm | 2Vpgm | 3Vpgm | 4Vpgm | 5Vpgm | 6Vpgm | ... |
| WL(n-1) | 1Vpass | 2Vpass | 1Vpass+Δ2a | 1Vpass+Δ3a | 1Vpass+Δ4a | 1Vpass+Δ5a | ... |
| WL(n-2) | 1Vpass | 1Vpass | 1Vpass+Δb | 1Vpass+Δ2b | 1Vpass+Δ3b | 1Vpass+Δ4b | ... |
| WL(n-3) | 1Vpass | 1Vpass | 1Vpass | 1Vpass+Δb | 1Vpass+Δ2b | 1Vpass+Δ3b | ... |
| WL(n-4) | 1Vpass | 1Vpass | 1Vpass | 1Vpass | 1Vpass+Δb | 1Vpass+Δ2b | ... |
| WL(n-5) | 1Vpass | 1Vpass | 1Vpass | 1Vpass | 1Vpass | 1Vpass+Δb | ... |
| ... | | | | | | | |

Unsel_WL (WL(n+5) to WL(n+1)), Sel_WL (WLn), Unsel_WL (WL(n-1) to WL(n-5))

FIG. 13A (a>b>c>d>e)

| Loop Count (LC) | | 1 | 2 | 3 | 4 | 5 | 6 | ... |
|---|---|---|---|---|---|---|---|---|
| Unsel_WL | WL(n+5) | 1Vpass | 1Vpass | 1Vpass | 1Vpass | 1Vpass | 1Vpass+Δe | ... |
| | WL(n+4) | 1Vpass | 1Vpass | 1Vpass | 1Vpass | 1Vpass+Δd | 1Vpass+Δ2d | ... |
| | WL(n+3) | 1Vpass | 1Vpass | 1Vpass | 1Vpass+Δc | 1Vpass+Δ2c | 1Vpass+Δ3c | ... |
| | WL(n+2) | 1Vpass | 1Vpass | 1Vpass+Δb | 1Vpass+Δ2b | 1Vpass+Δ3b | 1Vpass+Δ4b | ... |
| | WL(n+1) | 1Vpass | 1Vpass+Δa | 1Vpass+Δ2a | 1Vpass+Δ3a | 1Vpass+Δ4a | 1Vpass+Δ5a | ... |
| Sel_WL | WLn | 1Vpgm | 2Vpgm | 3Vpgm | 4Vpgm | 5Vpgm | 6Vpgm | ... |
| Unsel_WL | WL(n-1) | 1Vpass | 1Vpass+Δa | 1Vpass+Δ2a | 1Vpass+Δ3a | 1Vpass+Δ4a | 1Vpass+Δ5a | ... |
| | WL(n-2) | 1Vpass | 1Vpass | 1Vpass+Δb | 1Vpass+Δ2b | 1Vpass+Δ3b | 1Vpass+Δ4b | ... |
| | WL(n-3) | 1Vpass | 1Vpass | 1Vpass | 1Vpass+Δc | 1Vpass+Δ2c | 1Vpass+Δ3c | ... |
| | WL(n-4) | 1Vpass | 1Vpass | 1Vpass | 1Vpass | 1Vpass+Δd | 1Vpass+Δ2d | ... |
| | WL(n-5) | 1Vpass | 1Vpass | 1Vpass | 1Vpass | 1Vpass | 1Vpass+Δe | ... |
| | ... | | | | | | | |

FIG. 15

| | | [OFS#] |
|---|---|---|
| Vpgm | PL(1) | 1PGM_OFS1 |
| | | 1PGM_OFS2 |
| | | 1PGM_OFS3 |
| | | 1PGM_OFS4 |
| | PL(2) | 2PGM_OFS1 |
| | | 2PGM_OFS2 |
| | | 2PGM_OFS3 |
| | | 2PGM_OFS4 |
| | PL(3) | 3PGM_OFS1 |
| | | 3PGM_OFS2 |
| | | 3PGM_OFS3 |
| | | 3PGM_OFS4 |
| | PL(4) | 4PGM_OFS1 |
| | | 4PGM_OFS2 |
| | | 4PGM_OFS3 |
| | | 4PGM_OFS4 |
| Vpass | PL(1) | 1PASS_OFS1 |
| | | 1PASS_OFS2 |
| | | 1PASS_OFS3 |
| | | 1PASS_OFS4 |
| | PL(2) | 2PASS_OFS1 |
| | | 2PASS_OFS2 |
| | | 2PASS_OFS3 |
| | | 2PASS_OFS4 |
| | PL(3) | 3PASS_OFS1 |
| | | 3PASS_OFS2 |
| | | 3PASS_OFS3 |
| | | 3PASS_OFS4 |
| | PL(4) | 4PASS_OFS1 |
| | | 4PASS_OFS2 |
| | | 4PASS_OFS3 |
| | | 4PASS_OFS4 |

| | | [OFS#] |
|---|---|---|
| Vpgm | TEM (1C-2C) | 1PGM_OFS1 |
| | | 1PGM_OFS2 |
| | | 1PGM_OFS3 |
| | | 1PGM_OFS4 |
| | TEM (2C-3C) | 2PGM_OFS1 |
| | | 2PGM_OFS2 |
| | | 2PGM_OFS3 |
| | | 2PGM_OFS4 |
| | TEM (3C-4C) | 3PGM_OFS1 |
| | | 3PGM_OFS2 |
| | | 3PGM_OFS3 |
| | | 3PGM_OFS4 |
| | TEM (4C-5C) | 4PGM_OFS1 |
| | | 4PGM_OFS2 |
| | | 4PGM_OFS3 |
| | | 4PGM_OFS4 |
| Vpass | TEM (1C-2C) | 1PASS_OFS1 |
| | | 1PASS_OFS2 |
| | | 1PASS_OFS3 |
| | | 1PASS_OFS4 |
| | TEM (2C-3C) | 2PASS_OFS1 |
| | | 2PASS_OFS2 |
| | | 2PASS_OFS3 |
| | | 2PASS_OFS4 |
| | TEM (3C-4C) | 3PASS_OFS1 |
| | | 3PASS_OFS2 |
| | | 3PASS_OFS3 |
| | | 3PASS_OFS4 |
| | TEM (4C-5C) | 4PASS_OFS1 |
| | | 4PASS_OFS2 |
| | | 4PASS_OFS3 |
| | | 4PASS_OFS4 |

210

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0126705, filed on Sep. 29, 2020, in the Korean Intellectual Property Office, the entire disclosure of which is incorporated herein by reference.

BACKGROUND

1. Technical Field

The present disclosure relates to a memory device and method of operating the memory device, and more particularly, to a memory device capable of performing a program operation.

2. Related Art

Memory devices may include a volatile memory device in which stored data is lost when the supply of power is interrupted and a nonvolatile memory device in which stored data is retained even when the supply of power is interrupted.

Examples of the volatile memory device may include a dynamic random-access memory (DRAM) and a static random-access memory (SRAM). Examples of the nonvolatile memory device may include a read only memory (ROM), a programmable read only memory (PROM), an erasable PROM (EPROM), an electrically EPROM (EEPROM), a NAND flash, etc.

A memory device may include a memory cell array, peripheral circuits, and a logic circuit.

The memory cell array may include a plurality of memory cells, each of which may store data. A scheme that stores one bit of data in one memory cell is referred to as a single-level cell (SLC) scheme, and a scheme that stores two or more bits of data in one memory cell is referred to as a multi-level cell (MLC) scheme. The MLC scheme may be classified into a triple-level cell (TLC) scheme and a quadruple-level cell (QLC) scheme based on the number of bits that are stored in each memory cell. In the TLC scheme, three bits of data may be stored in one memory cell, and in the QLC scheme, four bits of data may be stored in one memory cell.

SUMMARY

An embodiment of the present disclosure may provide a memory device. The memory device may include a voltage code controller configured to generate a voltage code that generates a program voltage and pass voltages based on a number of times a program loop is performed, and a voltage generator configured to generate the program voltage and the pass voltages in response to the voltage code, transmit the program voltage to a selected word line, and transmit the pass voltages to unselected word lines, wherein the voltage generator is configured to sequentially increase the pass voltage that is applied to the unselected word lines, in order of proximity to the selected word line, as the number of times a program loop is performed increases.

An embodiment of the present disclosure may provide for a method of operating a memory device. The method may include setting up a first step voltage to increase a program voltage and a second step voltage to increase pass voltages, performing a program loop with an operation of applying the program voltage to a selected word line and a verify operation of verifying memory cells that are coupled to the selected word line, increasing the program voltage by the first step voltage when a number of times a program loop is performed increases, and increasing the pass voltages that are applied to unselected word lines by the second step voltage, in order of proximity to the selected word line, as the number of times a program loop is performed increases.

An embodiment of the present disclosure may provide for a method of operating a memory device. The method may include increasing a program voltage that is applied to a selected word line stepwise when a number of times a program loop is performed increases, increasing a pass voltage that is applied to unselected word lines adjacent to the selected word line stepwise as the number of times a program loop is performed increases, and increasing a number of unselected word lines to which the pass voltage increased stepwise is applied as the number of times a program loop is performed increases.

BRIEF DESCRIPTION OF THE DRAWINGS

FIG. 10 is a flowchart, illustrating a method of operating a memory device, according to an embodiment of the present disclosure.

FIGS. 11A and 11B are diagrams, illustrating a program operation, according to a first embodiment of the present disclosure.

FIGS. 12A and 12B are diagrams, illustrating a program operation, according to a second embodiment of the present disclosure.

FIGS. 13A and 13B are diagrams, illustrating a program operation, according to a third embodiment of the present disclosure.

FIGS. 14 and 15 are diagrams, illustrating a program operation, according to a fourth embodiment of the present disclosure.

FIGS. 16 and 17 are diagrams, illustrating a program operation, according to a fifth embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments of the present disclosure are directed to a memory device with enhanced reliability by controlling pass voltages applied to unselected word lines in a program operation, and a method of operating the memory device.

Figure 1:
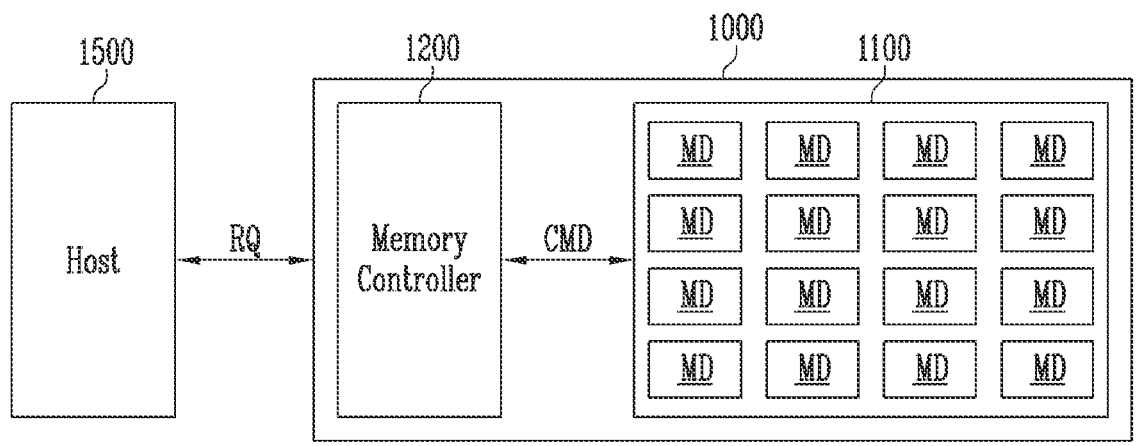
FIG. 1 is a diagram, illustrating a memory system, according to an embodiment of the present disclosure.

FIG. 1 is a diagram, illustrating a memory system, according to an embodiment of the present disclosure.

Referring to FIG. 1, a memory system 1000 may include a storage device 1100 and a memory controller 1200. The storage device 1100 may include a plurality of memory devices MD, which may be coupled to the memory controller 1200 via input/output lines.

The memory controller 1200 may communicate between a host 1500 and the memory device MD. The memory controller 1200 may create commands CMD that control the memory devices MD at a request RQ of the host 1500, and may perform a background operation for performance enhancement of the memory system 1000 even without the request RQ.

The host 1500 may create requests RQ for various operations and may output the requests RQ to the memory system 1000. For example, the requests RQ may include a program request to control a program operation, a read request to control a read operation, an erase request to control an erase operation.

The host 1500 may communicate with the memory system 1000 through various interfaces, such as peripheral component interconnect express (PCIe), advanced technology attachment (ATA), serial ATA, parallel ATA (PATA), serial attached small computer system interface (SAS), nonvolatile memory express (NVMe), a universal serial bus (USB), a multi-media card (MMC), an enhanced small disk interface (ESDI) or an integrated drive electronics (IDE).

Figure 2:
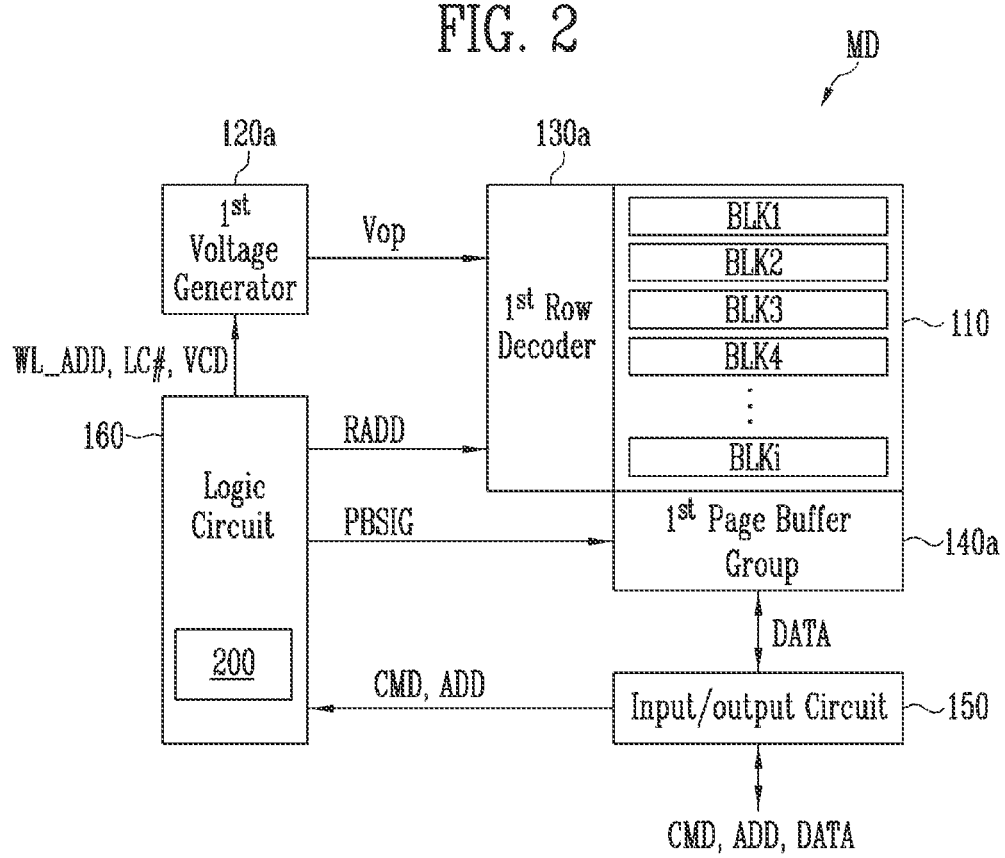
FIG. 2 is a diagram, illustrating a memory device, according to an embodiment of the present disclosure.

FIG. 2 is a diagram, illustrating a memory device, according to an embodiment of the present disclosure.

Referring to FIG. 2, a memory device MD may include a memory cell array 110 that stores data, peripheral circuits 120a to 150 that perform a program, read, or erase operations and a logic circuit 160 that controls the peripheral circuits 120a to 150.

The memory cell array 110 may include a plurality of memory blocks BLK1 to BLKi that stores data. Each of the memory blocks may include a plurality of memory cells, and the memory cells may be implemented in a two dimensional (2D) structure in which the memory cells are arranged in parallel with the substrate or in a three dimensional (3D) structure in which the memory cells are layered in a direction that is perpendicular to the substrate.

The peripheral circuits 120a to 150 may include a first voltage generator 120a, a first row decoder 130a, a first page buffer group 140a, and an input/output circuit 150.

The first voltage generator 120a may generate and output operating voltages Vop that are required for various operations in response to voltage codes VCD. For example, the first voltage generator 120a may generate and output a program voltage, a verify voltage, a read voltage, a pass voltage, an erase voltage, etc., which have various levels.

The first row decoder 130a may select one of the memory blocks BLK1 to BLKi that is included in the memory cell array 110 based on a row address (RADD) and may transmit operating voltages Vop to the selected memory block.

The first page buffer group 140a may be coupled to the memory cell array 110 through bit lines. For example, the first page buffer group 140a may include page buffers that are coupled to the respective bit lines. The page buffers may operate simultaneously in response to buffer control signals PBSIG and may temporarily store data in a program or read operation. A verify operation that is performed in the program operation and a verify operation that is performed in the erase operation may be performed in the same way as in the read operation. The page buffers may sense the voltage of the bit lines that varies based on threshold voltages of the memory cells in the read operation or verify operation. In other words, it may be determined based on a result of the sensing operation that is performed by the page buffers whether the threshold voltages of the memory cells are lower or higher than a read or verify voltage.

The input/output circuit 150 may be coupled to the memory controller 1200 of FIG. 1 through input/output lines. The input/output circuit 150 may input or output a command CMD, an address ADD, and data DATA through input/output lines. For example, the input/output circuit 150 may transmit the received command CMD and the address ADD to the logic circuit 160 through the input/output lines and may transfer data DATA that is received through the input/output lines to the first page buffer group 140a. The input/output circuit 150 may output the data DATA that is received from the first page buffer group 140a to the memory controller 1200 through the input/output lines.

The logic circuit 160 may output a voltage code VCD, a row address RADD, page buffer control signals PBSIG, and a column address (CADD), in response to a command CMD and an address ADD. For example, the logic circuit 160 may include software that performs an algorithm in response to a command CMD, and hardware configured to output various signals based on the algorithm. The logic circuit 160 may also include a voltage code controller 200 to change a program voltage and a pass voltage based on the loop in a program operation.

The voltage code controller 200 may be configured to output a voltage code VCD to change the program voltage and the pass voltage, a loop count (a count value, LC #), and a word line address WL_ADD. For example, the program operation may be performed on an incremental step pulse program (ISPP) basis that increases the program voltage stepwise. The ISPP based program operation may perform a plurality of loops. In each loop, an operation of applying a program voltage to a selected word line and an operation of verifying a threshold voltage of the memory cells may be performed. The voltage code controller 200 may output the voltage code VCD such that the program voltage and the pass voltage are incremented as the loop count LC #, which is the number of times a loop is performed, increases, and distribute and apply a program voltage and a pass voltage to a selected word line and unselected word lines based on the word line address (WL_ADD).

The program voltage may be a voltage to increase the threshold voltage of memory cells that are selected from among the memory cells that are coupled to the selected word line. The pass voltage may be a voltage that is applied to the unselected word line, to form a channel for strings by turning on the memory cells that are coupled to the unselected word line.

When the program voltage is applied to the selected word line that is coupled to the selected memory block, the pass voltages may be applied to the unselected word lines that are coupled to the selected memory block. The voltage code controller 200 may be configured to output a voltage code VCD to change the program voltage and the pass voltages as the loop count LC # increases.

Figure 3:
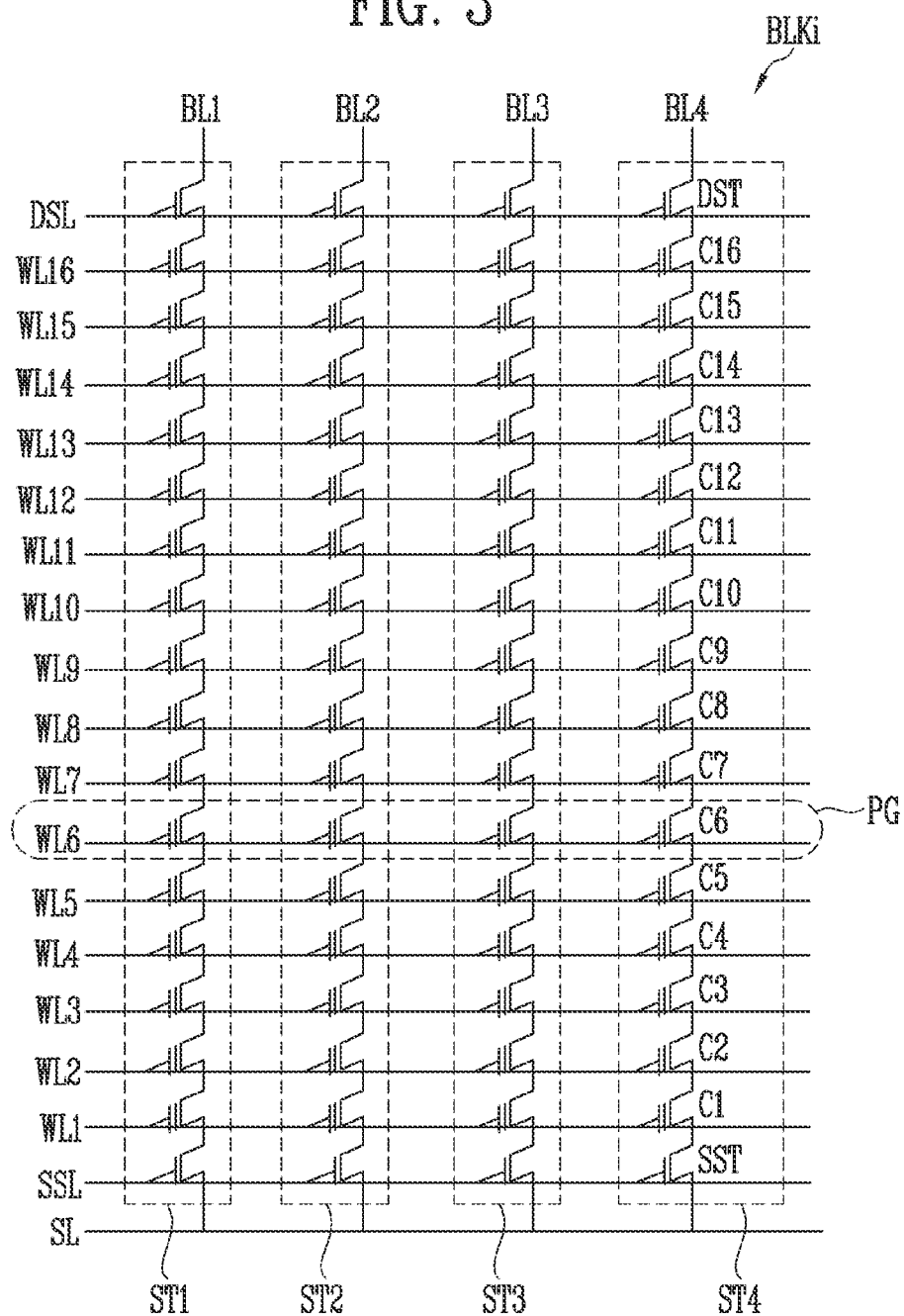
FIG. 3 is a diagram, illustrating a memory block, according to an embodiment of the present disclosure.

FIG. 3 is a diagram, illustrating a memory block, according to an embodiment of the present disclosure, e.g., the i-th memory block BLKi of the plurality of memory blocks BLK1 to BLKi illustrated in FIG. 1.

Referring to FIG. 3, the i-th memory block BLKi may include a plurality of strings ST1 to ST4. Although there are first to fourth strings ST1 to ST4 illustrated in FIG. 3, more strings may be included in the memory block.

The first to fourth strings ST1 to ST4 may be coupled between bit lines BL1 to BL4 and a source line SL. For example, the first string ST1 may be coupled between the first bit line BL1 and the source line SL, and the second string ST2 may be coupled between the second bit line BL2 and the source line SL.

Each of the first to fourth string ST1 to ST4 may include a source select transistor SST, a plurality of memory cells C1 to C16, and a drain select transistor DST, and, although not illustrated, further include dummy cells between the memory cells C1 to C16 and the source or drain select transistors SST or DST. Although the first to sixteenth memory cells C1 to C16 are illustrated in FIG. 3 for convenience of explanation, the strings ST1 to ST4 may include more memory cells. A string configuration of e.g., the fourth string ST4, may now be described in detail below.

The source select transistor SST that is included in the fourth string ST4 may electrically couple or decouple the source line SL and the first memory cell C1 to or from each other based on a voltage that is applied to the source select line SSL. Gates of the first to sixteenth memory cells C1 to C16 may be coupled to the first to sixteenth word lines WL1 to WL16, respectively. The drain select transistor DST may electrically couple or decouple the fourth bit line BL4 and the sixteenth memory cell C16 to or from each other based on a voltage that is applied to the drain select line DSL. Gates of the source select transistors SST that are included in the different strings ST1 to ST4 may be commonly coupled to the source select line SSL; the gates of the first to sixteenth memory cells C1 to C16 may be coupled to the first to sixteenth word lines WL1 to WL16; and gates of the drain select transistors DST may be commonly coupled to the drain select line DSL. A group of memory cells that is coupled to the same word line is referred to as a page PG, and the program and read operations may be performed in pages PG.

For a program operation, for example, a program voltage may be applied to a selected word line that is coupled to a selected page PG, and a pass voltage may be applied to the remaining word lines, that is, unselected word lines. The program voltage is a voltage to increase the threshold voltage of the selected memory cells, and the pass voltage is a voltage to form a channel for the strings by turning on the unselected memory cells that are included in the strings. For example, assuming that the sixth word line WL6 is the selected word line, the other first to fifth and seventh to sixteenth word lines WL1 to WL5 and WL7 to WL16 may be the unselected word lines. The program operation may be performed in a direction from the source select line SSL to the drain select line DSL or in a direction from the drain select line DSL to the source select line SSL.

Figure 4:
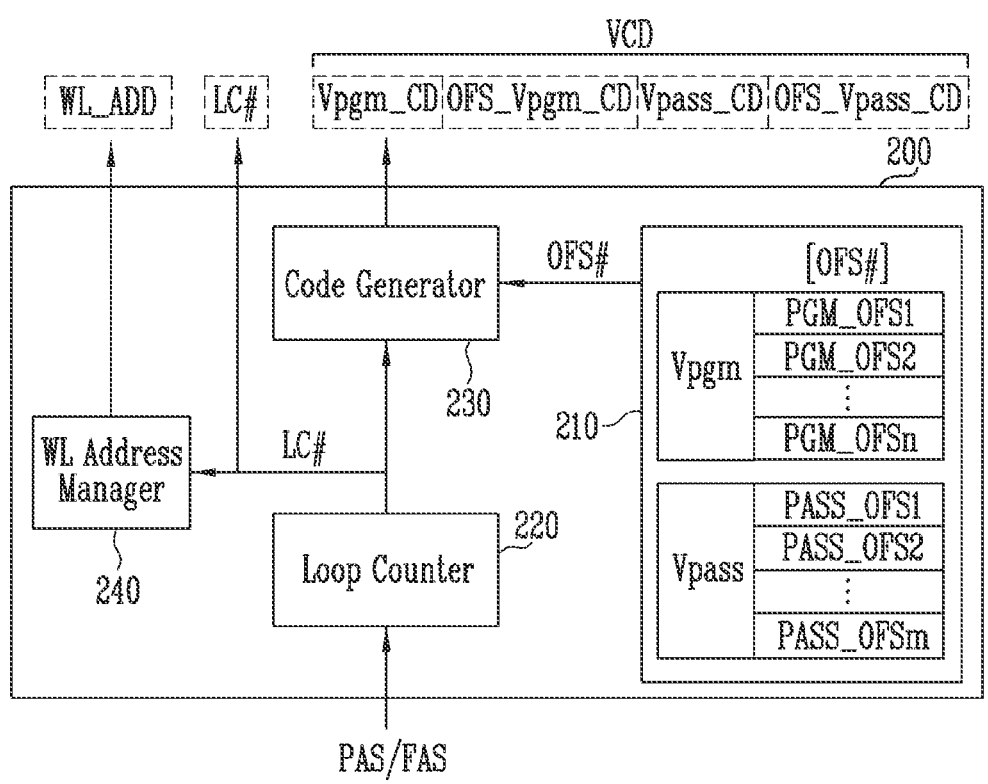
FIG. 4 is a diagram, illustrating a voltage code controller, according to an embodiment of the present disclosure.

FIG. 4 is a diagram, illustrating a voltage code controller, according to an embodiment of the present disclosure.

Referring to FIG. 4, the voltage code controller 200 may include an offset table 210, a loop counter 220, a code generator 230, and a word line (WL) address manager 240.

The offset table 210 may include various offset values OFS # for each of the program voltage Vpgm and the pass voltage Vpass. For example, the offset table 210 may include program offset values PGM_OFS1 to n that determine a step voltage of the program voltage Vpgm and pass offset values PASS_OFS1 to m for determining a step voltage of the pass voltage Vpass. Offset values that are selected from among the plurality of offset values that are stored in the offset table 210 may be set in advance based on electrical characteristics of the memory device.

The loop counter 220 may count the number of times a program loop is performed in the program operation for the selected page. For example, the loop counter 220 may increase the loop counter LC # by 1 when the verify operation for the selected page has failed and may reset the loop counter LC #1 when the verify operation for the selected page has passed. The logic circuit 160 of FIG. 2 may determine whether the verify operation has passed or failed based on data that is sensed by the first page buffer group 140a of FIG. 2, may generate a pass signal PAS when it is determined that the verify operation has passed, and may generate a fail signal FAS when the verify operation has failed.

The code generator 230 may receive a selected offset value OFS # from the offset table 210 and may output a voltage code VCD to which the offset value OFS # is applied based on the offset loop count LC #. The voltage code VCD may include a program voltage code Vpgm_CD, a program offset code OFS_Vpgm_CD, a pass voltage code Vpass_CD, a pass offset code OFS_Vpass_CD, and a loop count LC #. The program voltage code Vpgm_CD may be a code that generates a program voltage that is applied to the selected word line. The program offset code OFS_Vpgm_CD may be a code that indicates a variation level of the program voltage when the loop is changed. The pass voltage code Vpass_CD may be a code that generates pass voltages that are applied to the unselected word lines. The pass offset code OFS_Vpass_CD may be a code that indicates a variation level of the pass voltage when the loop is changed.

The code generator 230 may output the voltage code VCD when the loop count LC # is increased by 1 and might not output the voltage code VCD when the loop count LC #1 is reset to 0.

The word line address manager 240 may output a word line address WL_ADD with addresses of the selected word line and unselected word lines. For example, when the program operation for a selected memory block is started, the word line address manager 240 may set a default address of the selected word line to '1' and may set the unselected word lines to the rest of addresses. As the program loop for the selected word line increases, the loop count LC # increases, and when the loop count LC # is input, the word line address WL_ADD is output and when the loop count LC # is reset, the address of the selected word line may be changed to the next address. In other words, the word line address manager 240 may output the same word line address WL_ADD when the loop count LC # increases and may change the word line address WL_ADD when the loop count LC # is reset. For example, when the program operation for the memory cells that are coupled to the first word line is completed and the loop count LC # is reset, the word line address manager 240 may change the selected word line to the second word line and may change the addresses of the other word lines to the addresses of the unselected word lines.

Figure 5:
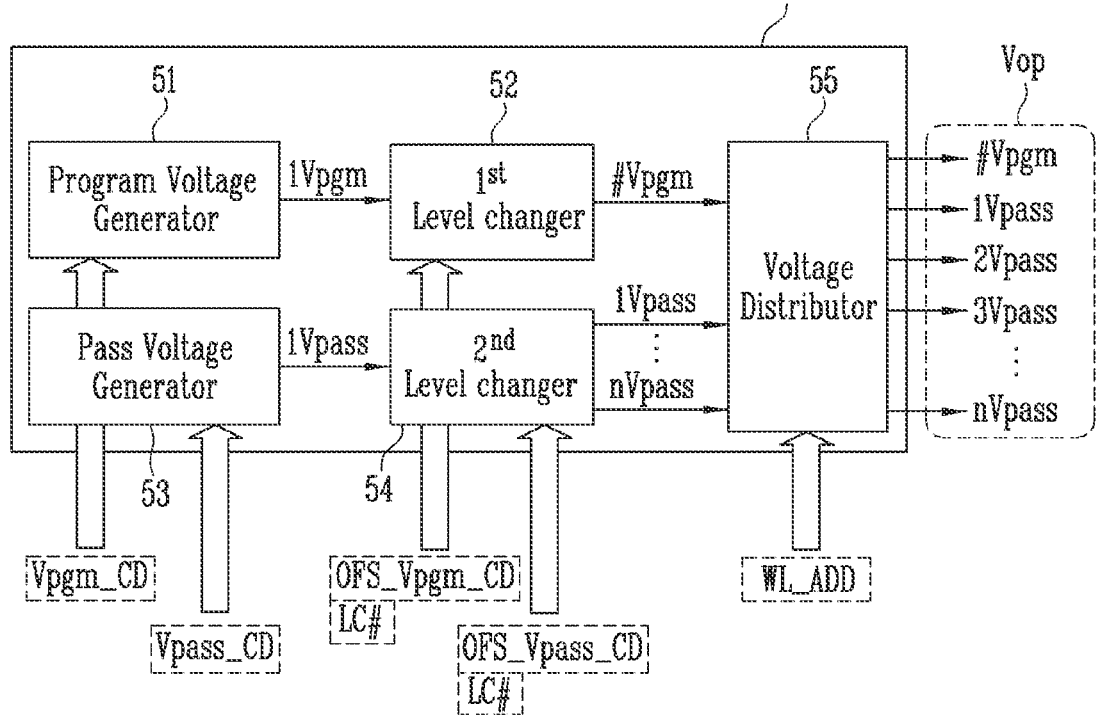
FIG. 5 is a diagram, illustrating a first voltage generator, according to an embodiment of the present disclosure.

FIG. 5 is a diagram, illustrating a first voltage generator, according to an embodiment of the present disclosure.

Referring to FIG. 5, the first voltage generator 120a may generate and output operating voltages Vop that are required for various operations in response to the voltage code VCD, the loop count LC #, and the word line address WL_ADD. For example, the first voltage generator 120a may include a program voltage generator 51, a first level changer 52, a pass voltage generator 53, a second level changer 54, and a voltage distributor 55.

The program voltage generator 51 may generate a first program voltage 1Vpgm in response to a program voltage code Vpgm_CD included in the voltage code VCD of FIG. 4. The first program voltage 1Vpgm is the lowest program voltage that is applied to the selected word line, which may be a starting program voltage.

The first level changer 52 may receive the first program voltage 1Vpgm and may output a program voltage #Vpgm in response to a program offset code OFS_Vpgm_CD and the loop count LC #. For example, the first level changer 52 may output the first program voltage 1Vpgm or a second program voltage that is obtained by adding the step voltage to the first program voltage 1Vpgm, in response to the loop count LC # and the program offset code OFS_Vpgm_CD. In this way, the first level changer 52 may output a program voltage #Vpgm that is increased by the step voltage from the previous program voltage when the loop count increases.

The pass voltage generator 53 may output a first pass voltage 1Vpass in response to a pass voltage code Vpass_CD. The first pass voltage 1Vpass may be the lowest pass voltage that is applied to the unselected word lines.

The second level changer 54 may receive the first pass voltage 1Vpass and may selectively output first to n-th pass voltages 1Vpass to nVpass in response to a pass offset code OFS_Vpgm_CD and a loop count LC #. The number of pass voltages that are output from the second level changer 54 and with different levels may be determined based on the loop count LC #. For example, when the loop count #LC is 1, the second level changer 54 may output only the first pass voltage 1Vpass. When the loop count #LC is 2, the second level changer 54 may output the first and second pass voltages 1Vpass and 2Vpass. The second pass voltage 2Vpass may be a voltage that is generated based on a pass offset code OFS_Pass_CD and may be higher than the first pass voltage 1Vpass by a step voltage. The step voltage for the pass voltage is different from the step voltage for the program voltage. When the loop count #LC is 3, the second level changer 54 may output the first to third pass voltages 1Vpass to 3Vpass. The third pass voltage 3Vpass is a voltage that is generated based on the pass offset code OFS_Pass_CD, and may be higher than the second pass voltage 2Vpass.

In an embodiment of the present disclosure, the second level changer 54 may increase the number of pass voltages based on a section to which the loop count LC # belongs. For example, when the loop count LC # belongs to a first section, the second level changer 54 may output only the first pass voltage 1Vpass; when the loop count LC # belongs to a second section, the second level changer 54 may output the first and second pass voltages 1Vpass and 2Vpass; and when the loop count LC # belongs to a third section, the second level changer 54 may output the first to third pass voltages 1Vpass to 3Vpass. The first to third sections each may refer to an interval of a certain number of loop counts LC #.

The voltage distributor 55, in response to the word line address WL_ADD, may be configured to apply the program voltage #Vpgm and the first to n-th pass voltages 1Vpass to nVpass as the operating voltages Vop to the respective word lines. Specifically, the operating voltages Vop that are output from the voltage distributor 55 may be applied to global word lines, and the operating voltages Vop that are applied to the global word lines may be transferred to local word lines that are coupled to a memory block that is selected by the first row decoder 130a of FIG. 2. The local word lines are word lines that are coupled to memory cells of the selected memory block.

The voltage distributor 55 may apply, based on the word line address WL_ADD, the program voltage #Vpgm to the selected word line and may apply the pass voltages to the unselected word lines, in which case a relatively high pass voltage may be applied to the unselected word line that is more adjacent to the selected word line. For example, the voltage distributor 55 may apply a high pass voltage to an unselected word line that is close to the selected word line and may sequentially apply relatively low pass voltages to unselected word lines that are farther from the selected word line.

For example, when the program voltage #Vpgm and the first pass voltage 1Vpass are applied to the voltage distributor 55, the voltage distributor 55 may apply the program voltage #Vpgm to the selected is word line and the first pass voltage 1Vpass to all of the unselected word lines. When the program voltage #Vpgm and the first and second pass voltages 1Vpass and 2Vpass are applied to the voltage distributor 55, the voltage distributor 55 may apply the program voltage #Vpgm to the selected word line, the second pass voltage 2Vpass to unselected word lines that are closest to the selected word line, and the first pass voltage 1Vpass to the remaining unselected word lines. When the program voltage #Vpgm and the first to third pass voltages 1Vpass to 3Vpass are applied to the voltage distributor 55, the voltage distributor 55 may apply the program voltage #Vpgm to the selected word line, the third pass voltage 3Vpass to unselected word lines that are closest to the selected word line, the second pass voltage 2Vpass to unselected word lines that are next closest to the selected word line, and the first pass voltage 1Vpass to the remaining unselected word lines.

The first pass voltage 1Vpass is the lowest pass voltage, the second pass voltage 2Vpass is higher than the first pass voltage 1Vpass, and the third pass voltage 3Vpass is higher than the second pass voltage 2Vpass.

Figure 6:
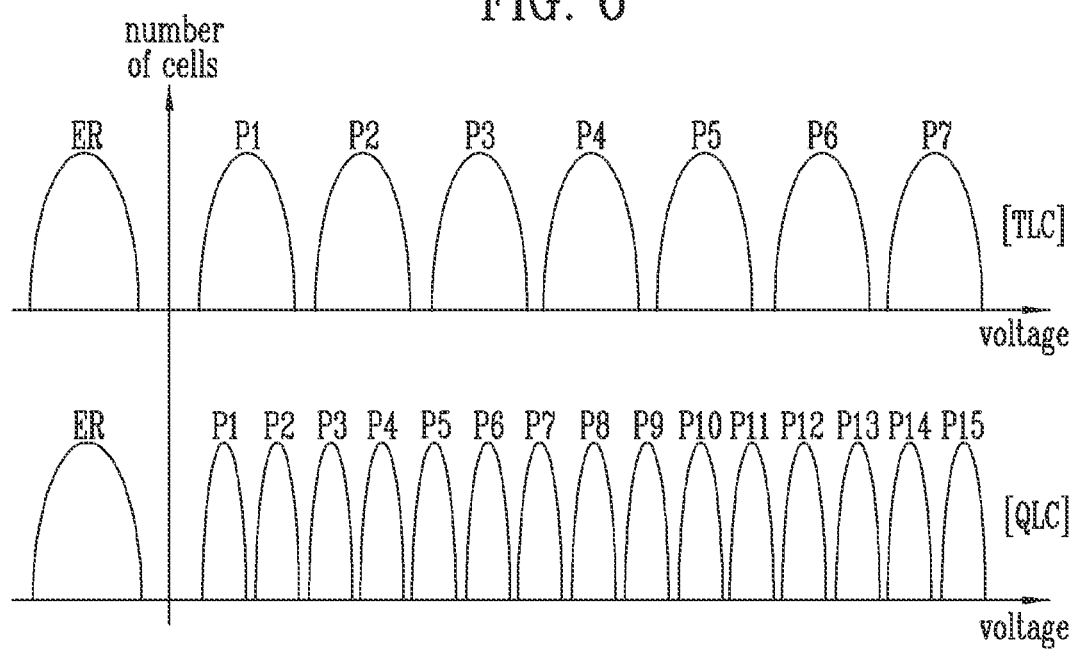
FIG. 6 is graph, illustrating threshold voltage distribution of memory cells.

FIG. 6 is a graph, illustrating threshold voltage distribution of memory cells.

Referring to FIG. 6, a program operation may be classified into various methods based on the number of bits that are stored in a memory cell. For example, a method in which three bit data is stored in a memory cell is called a triple level cell (TLC) method, and a method in which four bit data is stored in a memory cell is called a quadruple level cell (QLC) method.

In the TLC method, the state of the memory cell may be classified to one of an erased state ER or seven program states P1 to P7. In the QLC method, the state of the memory cell may be classified to one of an erased state ER or fifteen program states P1 to P15.

The number of bits that may be stored in a memory cell may be 5 or more, and there may be no limitations on the number of bits to be stored in a memory cell in the embodiment of the present disclosure.

Figure 7:
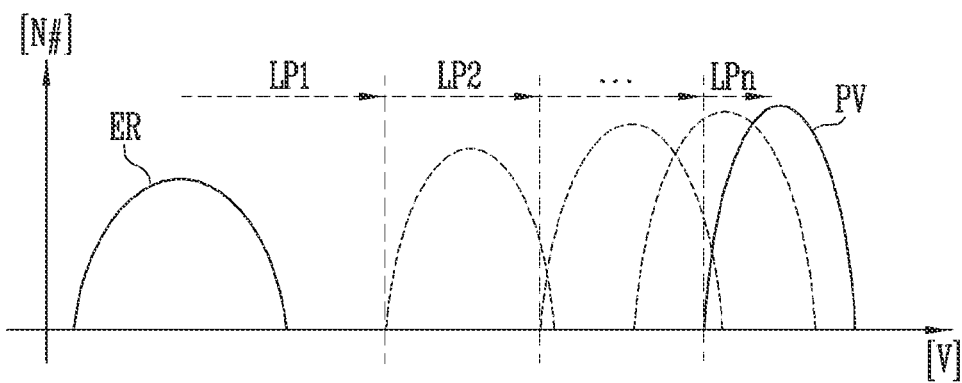
FIG. 7 is a graph, illustrating threshold voltages of memory cells that change by loop in a program operation.

FIG. 7 is a graph for explaining threshold voltages of memory cells that change by loop in a program operation.

Referring to FIG. 7, in a program operation for a selected page, a plurality of loops LP1 to LPn may be performed until the threshold voltage of the selected memory cells reaches a target level PV. For example, when the program operation is started, the selected memory cells may be in the erase state ER. When the first loop LP1 is performed by using a first program voltage, the threshold voltage of the selected memory cells may increase based on the first program voltage. Subsequently, when the second loop LP2 is performed, in which a second program voltage that is higher than the first program voltage is applied to the selected word line, the threshold voltage of the selected memory cells may increase based on the second program voltage. In this way, an n-th loop LPn may be performed.

As the plurality of memory cells that are included in the selected page may have different electrical characteristics and target levels PV, the number of loops that are performed until the target level PV is reached from the erased state ER may differ by memory cell.

The first to n-th loops LP1 to LPn will now be described in more detail.

Figure 8:
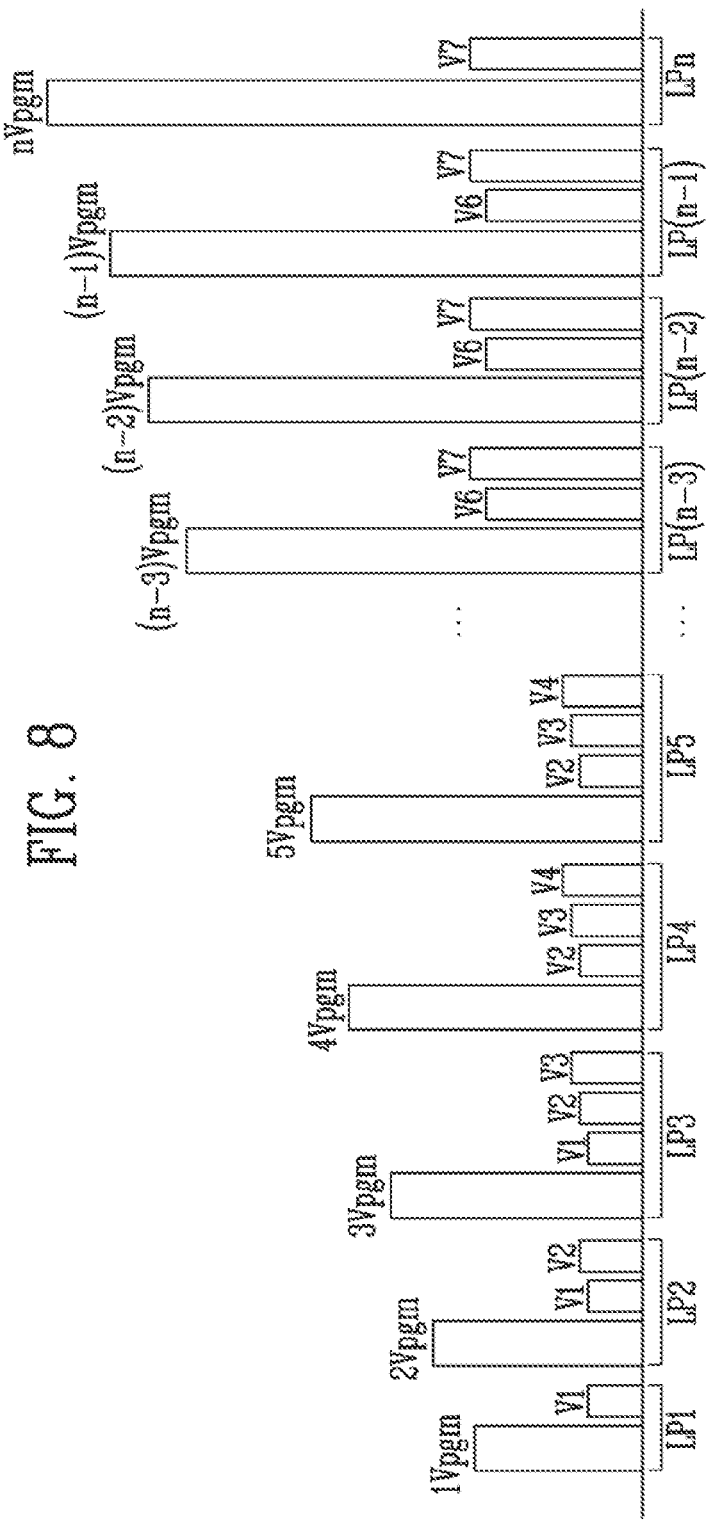
FIG. 8 is a diagram, illustrating an incremental step pulse programming (ISPP) based program operation.

FIG. 8 is a diagram, illustrating an ISPP based program operation.

Referring to FIG. 8, in an ISPP based program operation, first to n-th loops LP1 to LPn may be performed to increase the threshold voltage of the selected memory cells to the target level.

Assuming that an entire program operation in which the first to n-th loops LP1 to LPn are performed is a main program operation, a sub-program operation and a verify operation may be performed in each loop.

For example, when the main program operation for the selected page is started, the first to n-th loops LP1 to LPn may be sequentially performed. Here, n denotes a positive integer, which may be changed based on the result of the verify operation that is performed in each loop. The maximum value of n is preset, and when the verify operation has failed until n reaches the maximum value, the selected memory block may be processed as a bad block.

The sub-program operation that is performed in each of the first to n-th loops LP1 to LPn may be an operation in which the program voltage is applied to the selected word line, and the verify operation may be an operation to determine whether the threshold voltage of the memory cells has increased to the target voltage.

In FIG. 8, a TLC based main program operation is illustrated as an embodiment of the present disclosure. In the TLC based main program operation, the memory cells may be programmed with seven program states. Accordingly, in the verify operation, at least seven verify voltages may be used. For example, in the sub-program operation of the first loop LP1, the first program voltage 1Vpgm may be applied to the selected word line. The first program voltage 1Vpgm may correspond to the starting program voltage of the main program. The first program voltage 1Vpgm is a positive voltage that is greater than 0V, and the threshold voltage of the selected memory cells may increase based on the first program voltage 1Vpgm. In the sub-program operation, the selected memory cells may be memory cells that are coupled to bit lines to which a program permission voltage is applied, and the unselected memory cells may be memory cells that are coupled to bit lines to which a program inhibition voltage is applied. The program permission voltage may be 0V, and the program inhibition voltage may be a power voltage. In the verify operation of the first loop LP1, a first verify voltage V1 may be applied to the selected word line. The first verify voltage V1 may be a positive voltage that is greater than 0V, to determine whether the selected memory cells have been programmed to the first program state. When the verify operation of the first loop LP1 has failed, the second loop LP2 may be performed.

In the second loop LP2, the sub-program operation may be performed by using a second program voltage 2Vpgm that is greater than the first program voltage 1Vpgm, and verify operations for the first and second program states may be successively performed. For example, in the verify operation of the second loop LP2, a verify operation for the first program state and a verify operation for the second program state may be sequentially performed. In the verify operation for the first program state, the first verify voltage V1 may be used, and in the verify operation for the second program state, a second verify voltage V2 that is greater than the first verify voltage V1 may be used.

In the third loop LP3, the sub-program operation may be performed by using a third program voltage 3Vpgm that is greater than the second program voltage 2Vpgm, and verify operations for the first to third program states may be successively performed. In the verify operation for the first program state, the first verify voltage V1 may be used; in the verify operation for the second program state, the second verify voltage V2 that is greater than the first verify voltage V1 may be used; and in the verify operation for the third program state, a third verify voltage V3 that is greater than the second verify voltage V2 may be used. When the verify operation that is performed for the first program state has passed in the third loop LP3, the verify operation by using the first verify voltage V1 is not performed in the fourth loop LP4.

In the fourth loop LP4, the sub-program operation may be performed by using a fourth program voltage 4Vpgm that is greater than the third program voltage 3Vpgm, and verify operations for the second to fourth program states may be successively performed. In the verify operation for the fourth program state, a fourth verify voltage V4 that is greater than the third verify voltage V3 may be used.

The remaining loops may be performed in this way, when the verify operation that is performed in the n-th loop LPn has passed, the main program operation for the selected page may be ended.

Figure 9:
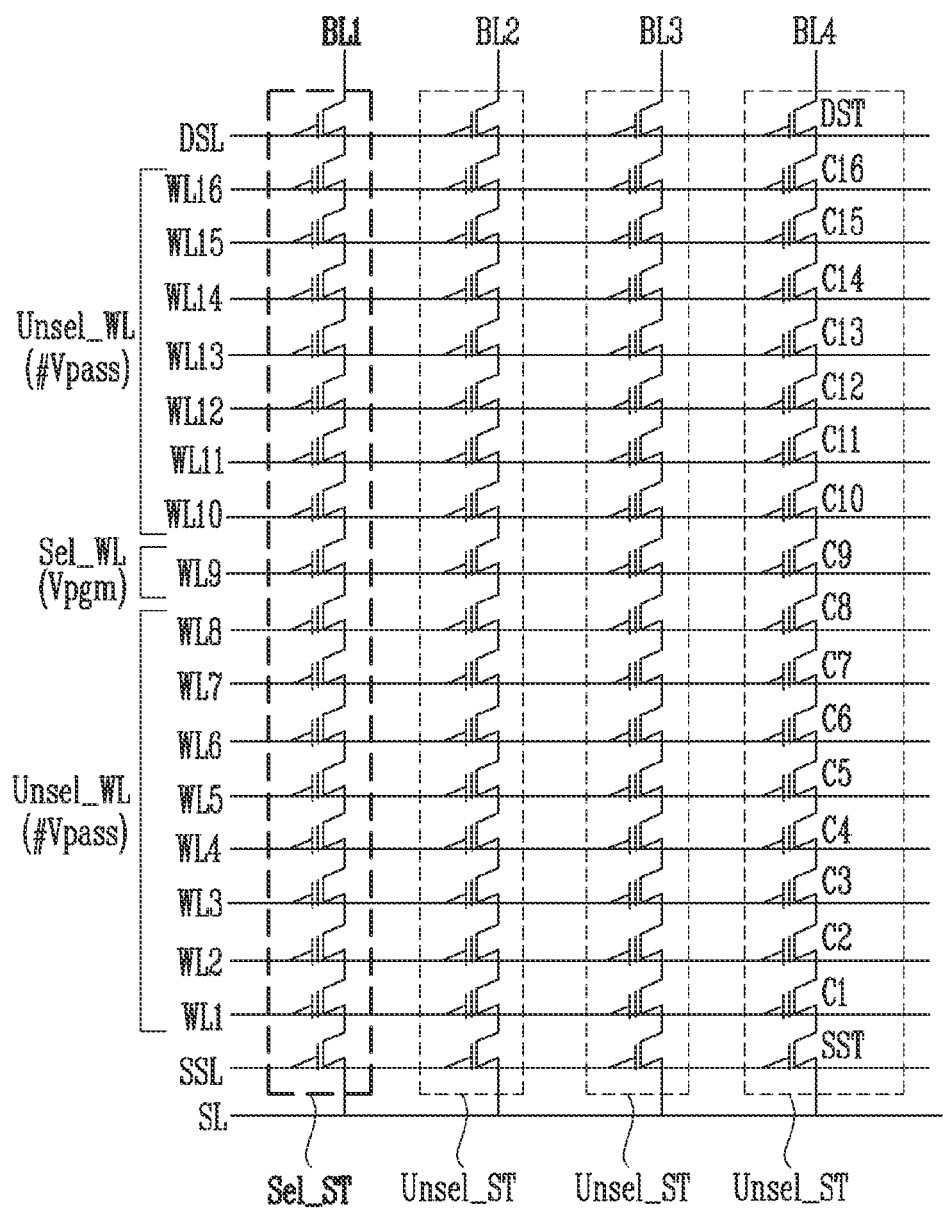
FIG. 9 is a diagram, illustrating voltages that are applied to word lines, coupled to a selected memory block.

FIG. 9 is a diagram, illustrating voltages that are applied to word lines, coupled to a selected memory block.

Referring to FIG. 9, a selected memory block may include a plurality of strings, and among the memory cells that are included in the selected pages, those that are included in the selected strings Sel_ST are subjected to programming. The program permission voltage may be applied to bit lines that are coupled to the selected strings Sel_ST, and the program inhibition voltage may be applied to bit lines that are coupled to unselected strings Unsel_ST. For example, assuming that one of the four strings, which is coupled to the first bit line BL1, is the selected string Sel_ST, and those coupled to the second to fourth bit lines BL2 to BL4 are unselected strings Unsel_ST, the program permission voltage may be applied to the first bit line BL1 and the program inhibition voltage may be applied to the second to fourth bit lines BL2 to BL4 in the program operation.

Assuming that of the first to sixteenth word lines WL1 to WL16, the ninth word line WL9 is the selected word line Sel_WL, the first to eighth word lines WL1 to WL8 and the tenth to sixteenth word lines WL10 to WL16 may be the unselected word lines Unsel_WL. In the program operation, the program voltage Vpgm may be applied to the selected word line Sel_WL, and pass voltages #Vpass may be applied to the unselected word lines Unsel_WL.

The pass voltages #Vpass that are applied to the unselected word lines Unsel_WL may be changed by the loop count of the selected page coupled to the selected word line Sel_WL. For example, as the loop count increases, the pass voltage that is applied to the unselected word lines Unsel_WL may be incremented in order of proximity to the selected word line Sel_WL.

In the embodiment of the present disclosure, how to apply the pass voltages to the unselected word lines will now be described in detail.

FIG. 10 is a flowchart, illustrating a method of operating a memory device, according to an embodiment of the present disclosure.

Referring to FIG. 10, one of a plurality of word lines that are included in a selected memory block is selected, at step S101. The sequence of a program operation that corresponds to the selected word line Sel_WL may be defined as N. Hence, N may be a positive integer. For example, for the selected word line Sel_WL that is coupled to a page to be programmed first, N is 1, and N is 2 for the selected word line Sel_WL that is coupled to a page to be programmed secondly.

The starting number of times the loop count LC is performed on the selected word line Sel_WL may be set to 1, at step S102.

The level of the program voltage Vpgm to be applied to the selected word line Sel_WL is set up based on a program voltage code, at step S103. The program voltage Vpgm that is set up at the loop count LC of 1 may be a starting program voltage.

The first pass voltage 1Vpass may be set up based on a pass voltage code, at step S104. The first pass voltage 1Vpass may be the lowest of the pass voltages to be applied to the unselected word lines. Subsequently, an offset of the pass voltage may be set up based on a pass offset code, at step S105. The offset of the pass voltage may define a difference between the pass voltages to be applied to the different unselected word lines and may be changed by the loop count LC.

The pass voltage for unselected word lines that are adjacent to the selected word line Sel_WL in a first direction is then set up. The pass voltage #Vpass to be applied to the (N−1)-th unselected word line Unsel_WL(N−1) may be set up at step S106. The (N−1)-th unselected word line Unsel_WL(N−1) may be the most adjacent line to the selected word line Sel_WL in the first direction. When the pass voltage #Vpass to be applied to the (N−1)-th unselected word line Unsel_WL(N−1) is set up, it is determined whether the (N−1)-th unselected word line Unsel_WL(N−1) is the last of the words lines that are arranged in the first direction from the selected word line Sel_WL, at step S107.

When the (N−1)-th unselected word line Unsel_WL(N−1) is not the last word line (in the case of No), the next unselected word line that is arranged in the first direction is selected, at step S108. For example, N−1 may substitute N for selecting the next unselected word line to the (N−1)-th unselected word line Unsel_WL(N−1). Until all the pass voltages #Vpass to be applied to unselected word lines that are arranged in the first direction are set up, steps S106 to S108 may be repeated.

All the pass voltages #Vpass to be applied to the unselected word lines that are arranged in the first direction are set up at step S107 (in the case of Yes), N is reset to a value of the selected word line Sel_WL at step S109.

A pass voltage for unselected word lines that are adjacent in a second direction from the selected word line Sel_WL is then set up. The second direction may be opposite to the first direction. A pass voltage #Vpass to be applied to the (N+1)-th unselected word line Unsel_WL(N+1) may be set up at step S110. The (N+1)-th unselected word line Unsel_WL(N+1) may be the most adjacent line to the selected word line Sel_WL in the second direction. When the pass voltage #Vpass to be applied to the (N+1)-th unselected word line Unsel_WL(N+1) is set up, it is determined whether the (N+1)-th unselected word line Unsel_WL(N+1) is the last of the words lines that are arranged in the second direction from the selected word line Sel_WL, at step S111. When the (N+1)-th unselected word line Unsel_WL(N+1) is not the last word line (in the case of NO), a next unselected word line that is arranged in the second direction is selected, at step S112. For example, N+1 may substitute N for selecting the next unselected word line to the (N+1)-th unselected word line Unsel_WL(N+1). Until all the pass voltages #Vpass to be applied to the unselected word lines that are arranged in the second direction are set up, steps S110 to S112 may be repeated.

When pass voltages #Vpass to be applied to the unselected word lines that are arranged in the second direction are all set up at step S111 (in the case of Yes), the program operation by using the established program voltage Vpgm and the pass voltages #Vpass may be performed, at step S113.

Subsequently, a verify operation for the program operation that is performed at step S113 may be performed at step S114. When the verify operation has passed (PASS), the program operation for the selected memory cells may be ended. When the verify operation has failed (FAIL), an operation of determining whether the loop count LC reaches a maximum value (MAX) may be performed, at step S115. The maximum value MAX of the loop count LC may be set in advance. When it is determined that the loop count LC reaches the maximum value MAX, the selected memory block may be processed as a bad block.

When it is determined that the loop count LC has not reached the maximum value MAX (in the case of No) at step S115, the loop count LC is increased by 1 at step S117, and the next loop may be performed from step S103.

The program operation may be performed in various methods based on the flowchart illustrated in FIG. 10, which will now be described with reference to FIGS. 11A to 13B.

Figure 11B:
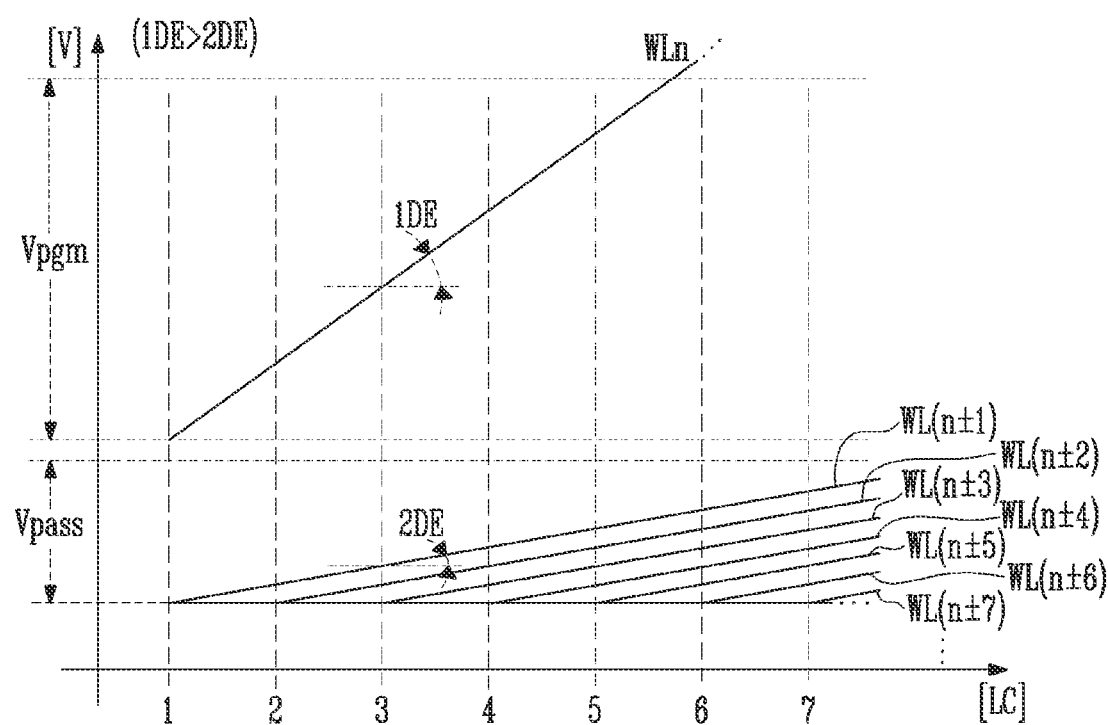

FIGS. 11A and 11B are diagrams, illustrating a program operation, according to a first embodiment of the present disclosure.

Referring to FIG. 11A, in a program operation for a selected page, voltages that are applied to the selected word line Sel_WL and the unselected word lines Unsel_WL for each loop count LC will now be described below.

It is assumed that the n-th word line WLn is a selected word line Sel_WL, and the other word lines WL(n±1) . . . are unselected word lines Unsel_WL.

In the first embodiment of the present disclosure, as the loop count LC increases, the program voltage may be increased by a first program offset value and the pass voltages to be applied to the unselected word lines Unsel_WL may be sequentially increased by a first pass offset value.

In the first program loop with the loop count LC of 1, the first program voltage 1Vpgm may be applied to the selected word line Sel_WL, and the first pass voltages 1Vpass may be applied to the unselected word lines Unsel_WL.

When the loop count LC is 2, the second program voltage 2Vpgm that is higher than the first program voltage 1Vpgm may be applied to the selected n-th word line WLn, the second pass voltage 2Vpass that is higher than the first pass voltage 1Vpass may be applied to the unselected (n±1)-th word lines WL(n±1), and the first pass voltage 1Vpass may be applied to the remaining unselected word lines Unsel_WL.

When the loop count LC is 3, the third program voltage 3Vpgm that is higher than the second program voltage 2Vpgm may be applied to the selected n-th word line WLn, the third pass voltage 3Vpass that is higher than the second pass voltage 2Vpass may be applied to the unselected (n±1)-th word lines WL(n±1), the second pass voltage 2Vpass may be applied to the unselected (n±2)-th word lines WL(n±2), and the first pass voltage 1Vpss may be applied to the remaining unselected word lines Unsel_WL.

When the loop count LC is 4, the fourth program voltage 4Vpgm that is higher than the third program voltage 3Vpgm may be applied to the selected n-th word line WLn, the fourth pass voltage 4Vpass that is higher than the third pass voltage 3Vpass may be applied to the unselected (n±1)-th word lines WL(n±1), the third pass voltage 3Vpass may be applied to the unselected (n±2)-th word lines WL(n±2), the second pass voltage 2Vpass may be applied to the unselected (n±3)-th word lines WL(n±3), and the first pass voltage 1Vpss may be applied to the remaining unselected word lines Unsel_WL.

Referring to FIG. 11B, the horizontal axis of the graph represents the loop count LP increasing to the right, and the vertical axis represents the voltage V increasing upward.

In the program operation in the first embodiment of the present disclosure, the program voltages 1Vpgm, 2Vpgm, 3Vpgm, . . . may increase with a first slope 1DE as the loop count LC increases.

When the loop count LC reaches 2 or more, incremented pass voltages Vpass may be applied to the (n±1)-th word lines WL(n±1) of the unselected word lines Unsel_WL, which are the closest to the selected word line Sel_WL.

When the loop count LC reaches 3 or more, incremented pass voltages Vpass may be applied to the unselected (n+2)-th word lines WL(n±2), and when the loop count LC reaches 4 or more, incremented pass voltages Vpass may be applied to the unselected (n±3)-th word lines WL(n±3).

In the first embodiment of the present disclosure, the pass voltages Vpass that are applied to the unselected (n 1)-th word lines WL(n±1) increases with a second slope 2DE in proportion to the loop count LC, and the pass voltages Vpass applied to the remaining unselected word lines may also sequentially increase with the second slope 2DE in proportion to the loop count LC. The second slope 2DE may be less than the first slope 1DE.

As described above, the pass voltage that is applied to the (n±1)-th word lines WL(n±1) that are adjacent to the selected word line Sel_WL may be set to be higher than the pass voltages applied to the remaining unselected word lines, thereby reducing a difference in channel voltage between the unselected word lines WL(n±1) adjacent to the selected word line Sel_WL. This may restrain the threshold voltage of unselected memory cells adjacent to a selected memory cells from increasing.

Furthermore, given that the higher the loop count LC, the higher the program voltage Vpgm, incremented pass voltage may be applied to unselected word lines with respect to the selected word line Sel_WL, thereby reducing the difference in channel voltage between the unselected memory cells and thus suppressing a phenomenon in which hot electrons occur.

Figure 12B:
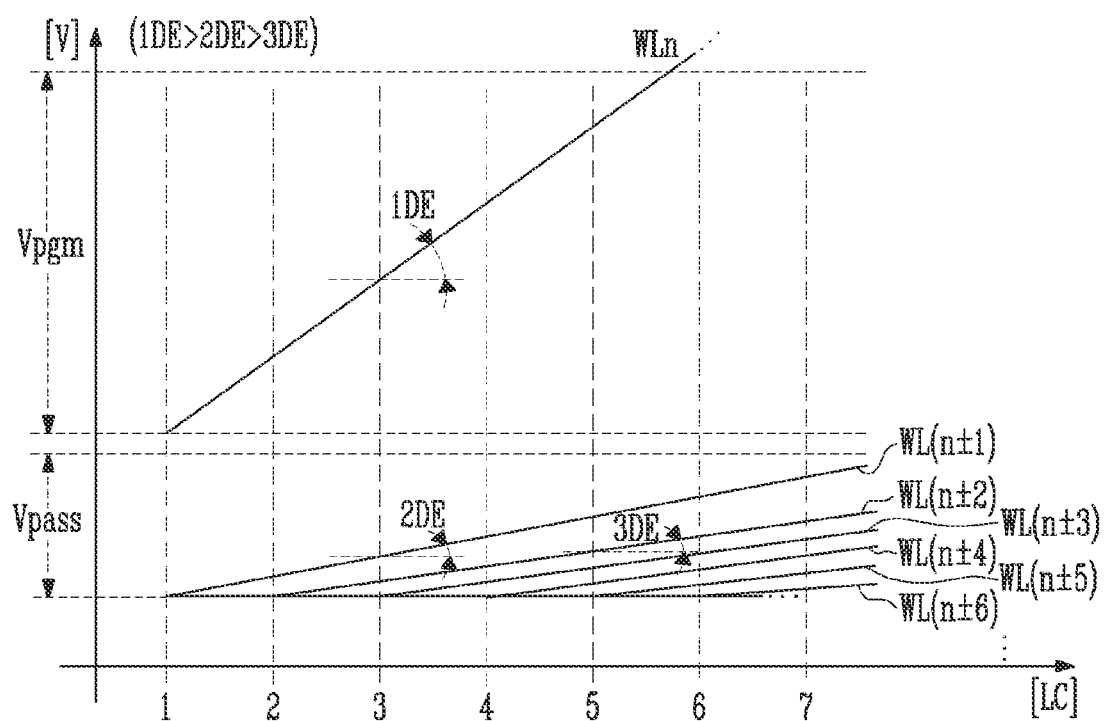

FIGS. 12A and 12B are diagrams, illustrating a program operation, according to a second embodiment of the present disclosure.

Referring to FIG. 12A, in a program operation for a selected page, voltages applied to the selected word line Sel_WL and the unselected word lines Unsel_WL for each loop count LC will now be described below.

It may be assumed that the n-th word line WLn is a selected word line Sel_WL, and the other word lines WL(n±1), . . . are unselected word lines Unsel_WL.

In the first program loop with the loop count LC of 1, the first program voltage 1Vpgm may be applied to the selected word line Sel_WL, and the first pass voltages 1Vpass may be applied to the unselected word lines Unsel_WL.

When the loop count LC is 2, the second program voltage 2Vpgm that is higher than the first program voltage 1Vpgm may be applied to the selected n-th word line WLn, a pass voltage 1Vpass+Δa that is higher than the first pass voltage 1Vpass by Δa may be applied to the unselected (n±1)-th word lines WL(n±1), and the first pass voltage 1Vpass may be applied to the remaining unselected word lines Unsel_WL. Here, 'a' may be a positive integer.

When the loop count LC is 3, the third program voltage 3Vpgm that is higher than the second program voltage 2Vpgm may be applied to the selected n-th word line WLn, a pass voltage 1Vpass+Δ2a that is higher than the first pass voltage 1Vpass by Δ2a may be applied to the unselected (n±1)-th word lines WL(n±1), a pass voltage 1Vpass+Δb that is higher than the first pass voltage 1Vpass by Δb may be applied to the unselected (n±2)-th word lines WL(n±2), and the first pass voltage 1Vpss may be applied to the remaining unselected word lines Unsel_WL. Here, 'b' may be a positive integer smaller than 'a'.

When the loop count LC is 4, the fourth program voltage 4Vpgm that is higher than the third program voltage 3Vpgm may be applied to the selected n-th word line WLn, a pass voltage 1Vpass+Δ3a that is higher than the first pass voltage 1Vpass by Δ3a may be applied to the unselected (n±1)-th word lines WL(n±1), a pass voltage 1Vpass+Δ2b that is higher than the first pass voltage 1Vpass by Δ2b may be applied to the unselected (n±2)-th word lines WL(n±2), a pass voltage 1Vpass+Δb that is higher than the first pass voltage 1Vpass by ab may be applied to the unselected (n±3)-th word lines WL(n±3), and the first pass voltage 1Vpss may be applied to the remaining unselected word lines Unsel_WL. In this way, as the loop count LC increases, an incremented pass voltage may be applied to the unselected word lines farther from the selected word line Sel_WL.

Referring to FIG. 12B, the horizontal axis of the graph represents the loop count LP, increasing to the right, and the vertical axis represents the voltage V increasing upward.

In a program operation in the second embodiment of the present disclosure, as the loop count LC increases, an increased portion of the pass voltages that are applied to the (n±1)-th word lines WL(n±1) that are adjacent to the selected word line Sel_WL may be greater than an increased portion of the pass voltages that are applied to the remaining unselected word lines. For example, when the pass voltages that are applied to the (n±1)-th word lines WL(n±1) increase with the second slope 2DE, pass voltages that are applied to the remaining unselected word lines may increase with a third slope 3DE, which is lower than the second slope 2DE. The pass voltage that is applied to the (n±1)-th word lines WL(n±1) adjacent to the selected word line Sel_WL may be set to be higher than the pass voltages applied to the remaining unselected word lines, thereby reducing a difference in channel voltage between the unselected word lines WL(n±1) adjacent to the selected word line Sel_WL. With a high slope means with a large offset value, which means that the more the loop count LC increases, the higher the voltage becomes.

This may restrain the threshold voltage of unselected memory cells adjacent to a selected memory cells from increasing.

Figure 13B:
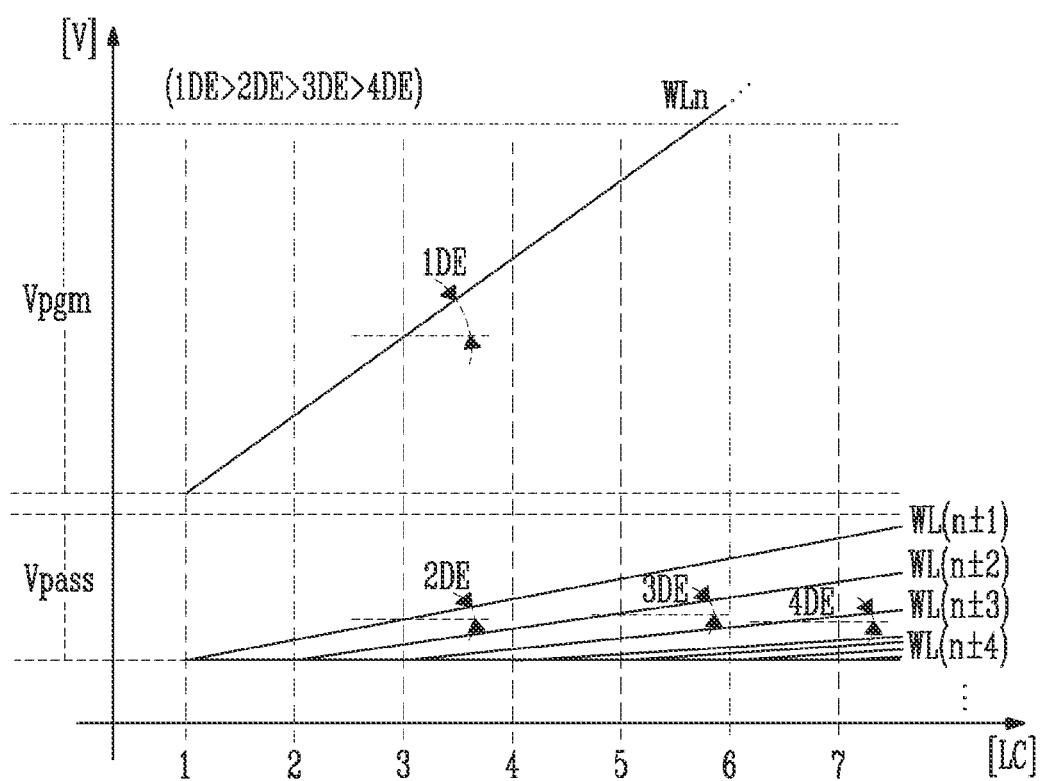

FIGS. 13A and 13B are diagrams, illustrating a program operation, according to a third embodiment of the present disclosure.

Referring to FIG. 13A, in a program operation for a selected page, voltages applied to the selected word line Sel_WL and the unselected word lines Unsel_WL for each loop count LC will now be described below.

It is assumed that the n-th word line WLn is a selected word line Sel_WL, and the other word lines WL(n±1), . . . are unselected word lines Unsel_WL.

In the first program loop with the loop count LC of 1, the first program voltage 1Vpgm may be applied to the selected word line Sel_WL, and the first pass voltages 1Vpass may be applied to the unselected word lines Unsel_WL.

When the loop count LC is 2, the second program voltage 2Vpgm that is higher than the first program voltage 1Vpgm may be applied to the selected n-th word line WLn, a pass voltage 1Vpass+Δa that is higher than the first pass voltage 1Vpass by Δa may be applied to the unselected (n±1)-th word lines WL(n±1), and the first pass voltage 1Vpass may be applied to the remaining unselected word lines Unsel_WL. Here, a may be a positive integer.

When the loop count LC is 3, the third program voltage 3Vpgm that is higher than the second program voltage 2Vpgm may be applied to the selected n-th word line WLn, a pass voltage 1Vpass+Δ2a that is higher than the first pass voltage 1Vpass by Δ2a may be applied to the unselected (n±1)-th word lines WL(n±1), a pass voltage 1Vpass+Δb that is higher than the first pass voltage 1Vpass by Δb may be applied to the unselected (n±2)-th word lines WL(n±2), and the first pass voltage 1Vpss may be applied to the remaining unselected word lines Unsel_WL. Here, 'b' may be a positive integer smaller than 'a'.

When the loop count LC is 4, the fourth program voltage 4Vpgm that is higher than the third program voltage 3Vpgm may be applied to the selected n-th word line WLn, a pass voltage 1Vpass+Δ3a that is higher than the first pass voltage 1Vpass by Δ3a may be applied to the unselected (n±1)-th word lines WL(n±1), a pass voltage 1Vpass+Δ2b that is higher than the first pass voltage 1Vpass by Δ2b may be applied to the unselected (n±2)-th word lines WL(n±2), a pass voltage 1Vpass+Δc that is higher than the first pass voltage 1Vpass by Δc may be applied to the unselected (n±3)-th word lines WL(n±3), and the first pass voltage 1Vpss may be applied to the remaining unselected word lines Unsel_WL. In this way, as the loop count LC increases, an incremented pass voltage may be sequentially applied to the unselected word lines farther from the selected word line Sel_WL. Here, 'a', 'b', and 'c' are positive integers, b smaller than 'a', and 'c' smaller than 'b'. In this way, the farther the distance from the word line Sel_WL, the lower the increased portion of the pass voltage to be applied to the unselected word lines.

Referring to FIG. 13B, the horizontal axis of the graph represents the loop count LP increasing to the right, and the vertical axis represents the voltage V increasing upward.

In a program operation in the third embodiment of the present disclosure, as the loop count LC increases, the pass voltage that is applied to the unselected word lines is incremented, but the increased portion of the pass voltages may decrease the farther the unselected word line is from the selected word line Sel_WL. For example, when the pass voltages applied to the (n+1)-th word lines WL(n±1) increase with the second slope 2DE, pass voltages applied to the (n±2)-th word lines WL(n±2) may increase with the third slope 3DE lower than the second slope 2DE, and pass voltages applied to the (n±3)-th word lines WL(n±3) may increase with a fourth slope 3DE, which is lower than the third slope 3DE.

The pass voltage that is applied to the (n±1)-th word lines WL(n±1) that are adjacent to the selected word line Sel_WL may be set to be higher than the pass voltages applied to the remaining unselected word lines, thereby reducing a difference in channel voltage between the unselected word lines WL(n±1) that are adjacent to the selected word line Sel_WL. This may restrain the threshold voltage of unselected memory cells adjacent to a selected memory cells from increasing.

Figure 14:
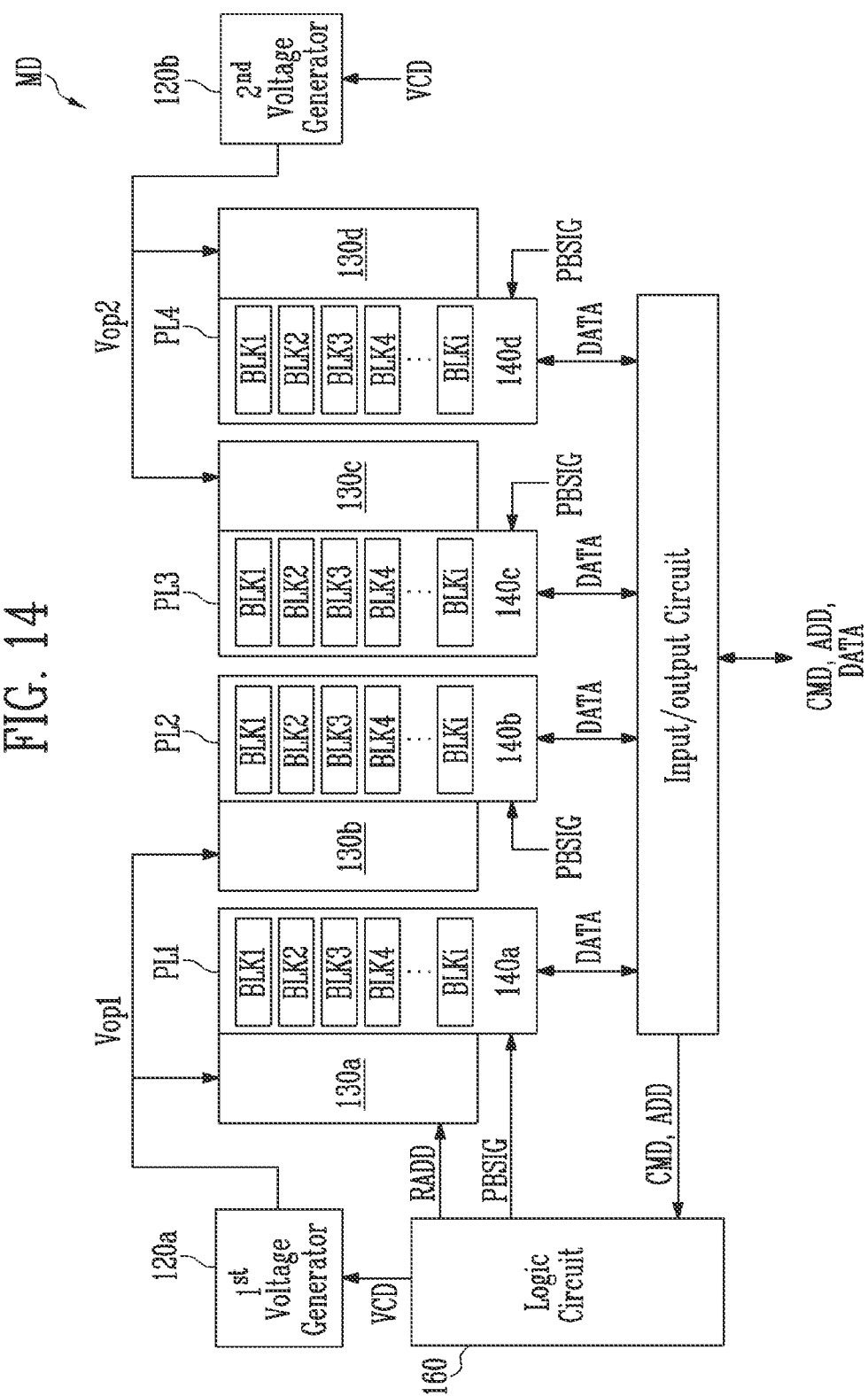

FIGS. 14 and 15 are diagrams, illustrating a program operation, according to a fourth embodiment of the present disclosure.

Referring to FIG. 14, embodiments of the present disclosure may also be applied to a memory device MD with a multi-plane structure. The memory device MD, illustrated in FIG. 14, has some parts similar to those of the memory device MD illustrated in FIG. 2, so the description will now be focused on parts different from the memory device MD of FIG. 2.

The memory device MD with the multi-plane structure may include a plurality of planes PL1 to PL4 each with a plurality of memory blocks BLK1 to BLKi. For example, the memory device MD may include first to fourth planes PL1 to PL4. The first to fourth planes PL1 to PL4 may be respectively coupled to different row decoders 130a to 130d and page buffer groups 140a to 140d. The first plane PL1 may be coupled to the first row decoder 130a and the first page buffer group 140a, the second plane PL2 may be coupled to the second row decoder 130b and the second page buffer group 140b, the third plane PL3 may be coupled to the third row decoder 130c and the third page buffer group 140c, and the fourth plane PL4 may be coupled to the fourth row decoder 130d and the fourth page buffer group 140d.

First operating voltages Vop1 that are output from the first voltage generator 120a may be transmitted to the first and second decoders 130a and 130b, and second operating voltages Vop2 that are output from the second voltage generator 120b may be transmitted to the third and fourth decoders 130c and 130d. The first to fourth page buffers 140a to 140d may operate simultaneously in response to page buffer control signals PBSIG that are output from the logic circuit 160.

In the memory device MD with the multi-plane structure, the distance for the operating voltages Vop1 and Vop2 to be transmitted to the first to fourth planes PL1 to PL4 is longer than in the single plane structure, so there may be a difference in electrical characteristics as compared with the single plane structure as illustrated in FIG. 2. Hence, in the fourth embodiment of the present disclosure, the offset of the pass voltages applied to the unselected word lines may be adjusted by further considering information about the number of selected planes.

Referring to FIG. 15, in the memory device MD with the multi-plane structure, an offset table 210 may include program offset values 1PGM_OFS1 to 4, 2PGM_OFS1 to 4, 3PGM_OFS1 to 4, and 4PGM_OFS1 to 4, and pass offset values 1PASS_OFS1 to 4, 2PASS_OFS1 to 4, 3PASS_OFS1 to 4, and 4PASS_OFS1 to 4, which are separated by the number of planes. For example, when there is one plane PL(1) included in the memory device MD, one of the first program offset values 1PGM_OFS1 to 4 and one or more offset values of the first pass offset values 1PASS_OFS1 to 4 may be used.

Figure 16:
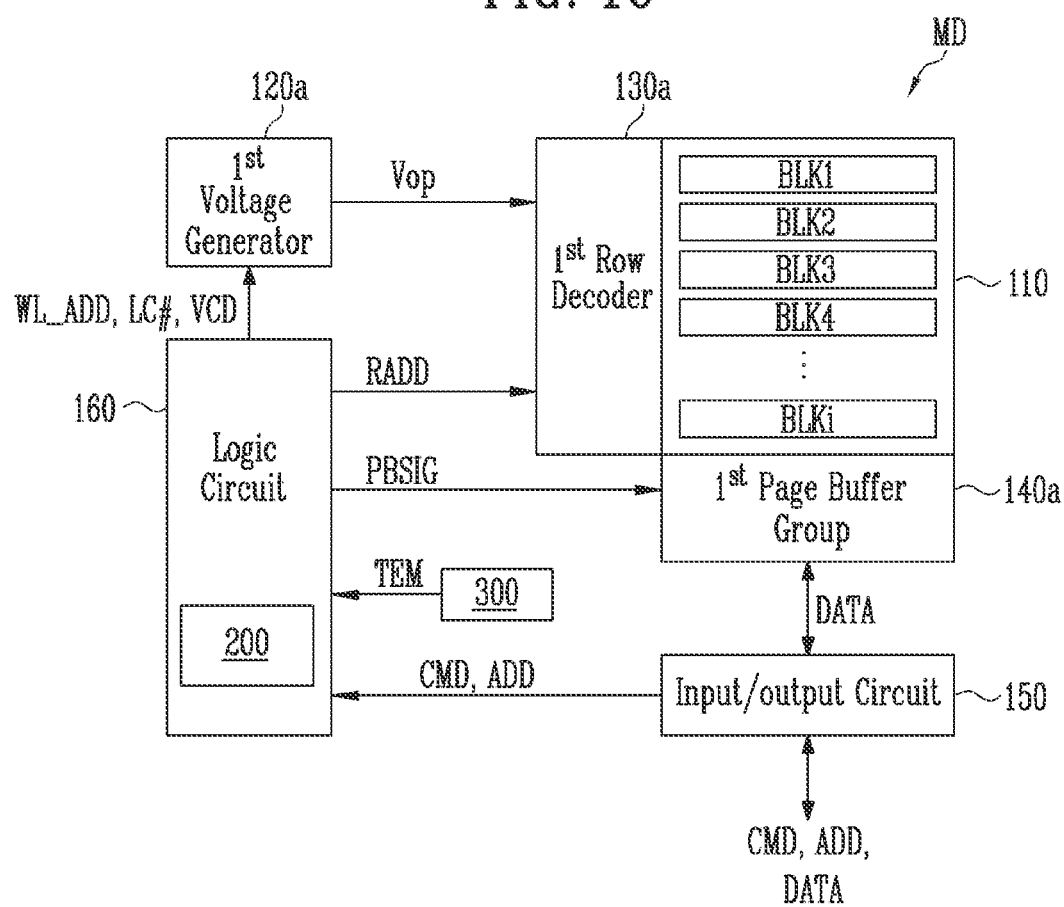

FIGS. 16 and 17 are diagrams, illustrating a program operation, according to a fifth embodiment of the present disclosure.

Referring to FIG. 16, a memory device MD in the fifth embodiment of the present disclosure has a similar structure as the memory device MD as illustrated in FIG. 2, so the overlapping parts might not be described.

The memory device MD of FIG. 16 may further include a temperature sensor 300. The temperature sensor 300 may detect an internal temperature of the memory device MD, generate and output temperature information TEM for the detected temperature to the logic circuit 160. The voltage code controller 200 included in the logic circuit 160 may select offset values to be applied to the program voltage and the pass voltage based on the temperature information TEM.

Referring to FIG. 17, in the memory device MD with the temperature sensor 300, the offset table 210 may include program offset values 1PGM_OFS1 to 4, 2PGM_OFS1 to 4, 3PGM_OFS1 to 4, and 4PGM_OFS1 to 4, and pass offset values 1PASS_OFS1 to 4, 2PASS_OFS1 to 4, 3PASS_OFS1 to 4, and 4PASS_OFS1 to 4, which are separated by temperature. For example, when a temperature in the memory device MD belongs to a first temperature range 1C-2C, one of the first program offset values 1PGM_OFS1 to 4 and one or more of the first pass offset values 1PASS_OFS1 to 4 may be used.

The aforementioned first to fifth embodiments of the present disclosure may be used separately or in combination.

Figure 18:
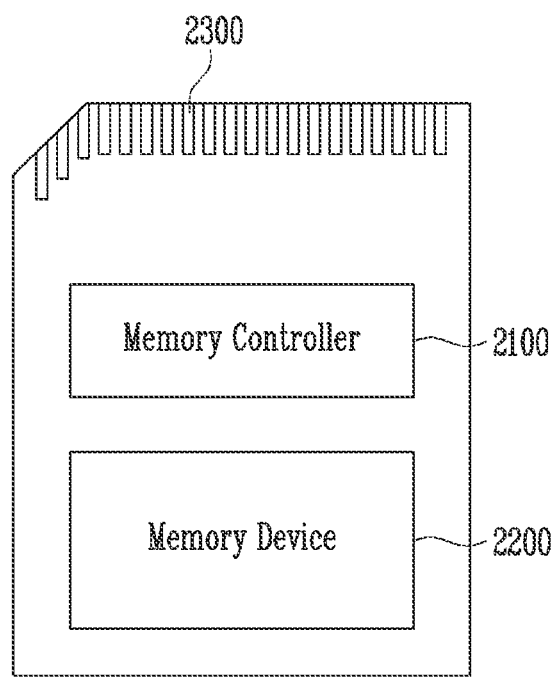
FIG. 18 is a diagram, illustrating a memory card system to which a memory device, according to an embodiment of the present disclosure, is applied.

FIG. 18 is a diagram, illustrating a memory card system to which a memory device, according to an embodiment of the present disclosure, is applied.

Referring to FIG. 18, a memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control a program, a read, or an erase operation of the memory device 2200, or may control a background operation of the memory device 2200. The memory controller 2100 may provide an interface between the memory device 2200 and a host. The memory controller 2100 may run firmware that controls the memory device 2200. The memory device 2200 may be operated in the same manner as the memory device MD, described above with reference to FIG. 2, 14 or 16.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various interface protocols, such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), WIFI, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

The memory controller 2100 and the memory device 2200 is may be integrated into a single semiconductor device to form a memory card. For example, the memory controller 2100 and the memory device 2200 may be integrated into a single semiconductor device to form a memory card, such as a personal computer memory card international association (PCMCIA), a compact flash card (CF), a smart media card (SM or SMC), a memory stick multimedia card (MMC, RS-MMC, MMCmicro or eMMC), a SD card (SD, miniSD, microSD, or SDHC), a universal flash storage (UFS), or the like.

Figure 19:
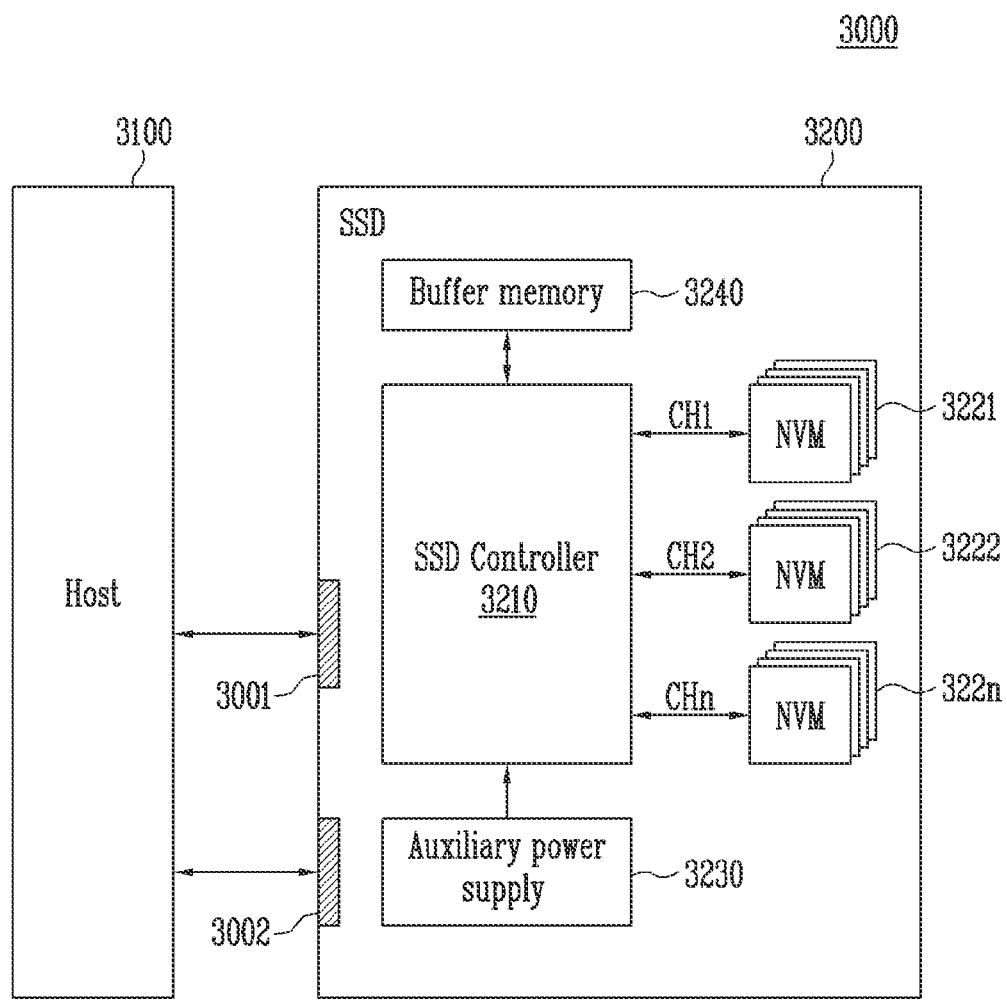
FIG. 19 is a diagram, illustrating a solid state drive (SSD) system to which a memory device, according to the present disclosure, is applied.

FIG. 19 is a diagram, illustrating a solid state drive (SSD) system to which a memory device, according to the present disclosure, is applied.

Referring to FIG. 19, an SSD system 3000 may include a host 3100 and an SSD 3200. The SSD 3200 may exchange a signal with the host 3100 through a signal connector 3001, and may receive a power voltage through a power connector 3002. The SSD 3200 may include an SSD controller 3210, a plurality of flash memories 3221 to 322$n$, an auxiliary power supply 3230, and a buffer memory 3240.

In accordance with an embodiment of the present disclosure, the flash memories 3221 to 322$n$ may be configured in the same manner as the memory device MD, described above with reference to FIG. 2, 14 or 16.

The SSD controller 3210 may control the plurality of flash memories 3221 to 322$n$ in response to signals received from the host 3100. In an embodiment, the signals may be signals based on the interfaces of the host 3100 and the SSD 3200. For example, such a signal may be a signal defined by at least one of various interfaces, such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied with power from the host 3100, and may be charged. The auxiliary power supply 3230 may supply the power of the SSD 3200 when the supply of power from the host 3100 is not smoothly performed. In an embodiment, the auxiliary power supply 3230 may be located inside the SSD 3200 or located outside the SSD 3200. For example, the auxiliary power supply 3230 may be located in a main board, and may also provide auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories, such as a DRAM, an SDRAM, a DDR SDRAM, and an LPDDR SDRAM or nonvolatile memories, such as an FRAM, a ReRAM, an STT-MRAM, and a PRAM.

The present disclosure may enhance the reliability of a memory device capable of performing a program operation.

What is claimed is:

1. A memory device, comprising:
    a voltage code controller configured to generate a voltage code that generates a program voltage and pass voltages based on a number of times a program loop is performed; and
    a voltage generator configured to generate the program voltage and the pass voltages in response to the voltage code, transmit the program voltage to a selected word line, and transmit the pass voltages to unselected word lines,
    wherein the voltage generator is configured to sequentially increase the pass voltage that is applied to the unselected word lines, in order of proximity to the selected word line, as the number of times a program loop is performed increases.

2. The memory device according to claim 1, wherein the voltage code controller comprises:
    an offset table with a plurality of different program offset values to increase the program voltage stepwise and a plurality of different pass offset values to increase the pass voltage stepwise;
    a loop counter configured to output a loop count by counting the number of times a program loop is performed;
    a code generator configured to, in response to the loop count, receive the program offset value and the pass offset value that are selected from the offset table and output the voltage code based on the program offset value and the pass offset value; and
    a word line address manager configured to output addresses of the selected word line and the unselected word lines.

3. The memory device according to claim 2, wherein the program offset value and the pass offset value that are selected from the offset table are preset based on characteristics of the memory device.

4. The memory device according to claim 2, wherein the loop counter is configured to increase and output the loop count when a verify operation that is performed in a program loop is determined to have failed and is configured to reset the loop count when the verify operation is determined to have passed.

5. The memory device claim 4, wherein the word line address manager is configured to change an address of the selected word line when the loop count is reset.

6. The memory device according to claim 2, wherein the code generator is configured to:
    generate, in response to the loop count, a program voltage code that generates the program voltage and a pass voltage code that generates the pass voltage,
    generate a program offset code and a pass offset code based on the program offset value and the pass offset value, and
    output the voltage code with the program voltage code, the pass voltage code, the program offset code, and the pass offset code.

7. The memory device according to claim 1, wherein the voltage generator comprises:
    a program voltage generator configured to generate a first program voltage;
    a first level changer configured to receive the first program voltage and configured to output the program voltage by changing a level of the first program voltage based on the program offset value;
    a pass voltage generator configured to generate a first pass voltage;
    a second level changer configured to receive the first pass voltage and configured to output the pass voltages with different levels by changing a level of the first pass voltage based on the pass offset value; and
    a voltage distributor configured to transmit the program voltage and the pass voltages to the respective word lines based on a word line address.

8. The memory device according to claim 7, wherein the program voltage generator is configured to generate the first program voltage in response to a program voltage code that is output from the voltage code controller.

9. The memory device according to claim 7, wherein the first level changer is configured to generate the program voltage that is higher than the first program voltage in response to a loop count and the program offset code that is output from the voltage code controller.

10. The memory device according to claim 7, wherein the pass voltage generator is configured to generate the first pass voltage in response to a pass voltage code that is output from the voltage code controller.

11. The memory device according to claim 7, wherein the second level changer is configured to generate the pass voltages higher than the first pass voltage, in response to a loop count and the pass offset code that is output from the voltage code controller.

12. The memory device according to claim 7, wherein, in response to the word line address, the voltage distributor is configured to transfer the program voltage to the selected word line and the pass voltages to the unselected word lines in order of proximity to the selected word line.

13. A method of operating a memory device, comprising:
    setting up a first step voltage to increase a program voltage and a second step voltage to increases pass voltages;
    performing a program loop with an operation of applying the program voltage to a selected word line and a verify operation of verifying memory cells that are coupled to the selected word line;
    increasing the program voltage by the first step voltage when a number of times a program loop is performed increases; and
    increasing the pass voltages that are applied to unselected word lines by the second step voltage, in order of proximity to the selected word line, as the number of times a program loop is performed increases.

14. The method according to claim 13, wherein increasing the pass voltages by the second step voltage comprises:
- applying a first pass voltage to the unselected word lines in a first program loop;
- applying a second pass voltage that is higher than the first pass voltage based on the second step voltage to first unselected word lines that are adjacent to the selected word line among the unselected word lines and the first pass voltage to remaining unselected word lines in a second program loop; and
- applying a third pass voltage that is higher than the second pass voltage by the second step voltage to the first unselected word lines, the second pass voltage that is higher than the first pass voltage by the second step voltage to second unselected word lines that are adjacent to the first unselected word lines, and the first pass voltage to the remaining unselected word lines in a third program loop.

15. The method according to claim 13, wherein the second step voltage is set up to be lower than the first step voltage.

16. A method of operating a memory device, comprising:
- increasing a program voltage that is applied to a selected word line stepwise when a number of times a program loop is performed increases;
- increasing a pass voltage that is applied to unselected word lines that are adjacent to the selected word line stepwise as the number of times a program loop is performed increases; and
- increasing a number of unselected word lines to which the pass voltage increased stepwise is applied as the number of times a program loop is performed increases.

17. The method according to claim 16, wherein, as the number of times a program loop is performed increases, the pass voltage that increases stepwise is applied to the unselected word lines in order of proximity to the selected word line.

18. The method according to claim 17, wherein the pass voltage, applied to unselected word lines that are closest to the selected word line, increases stepwise by a first step voltage, and
- wherein the pass voltage, applied to the remaining unselected word lines, increases stepwise by a second step voltage that is lower than the first step voltage.

19. The method according to claim 17, wherein the pass voltage, applied to unselected word lines that are closest to the selected word line, increases stepwise by a first step voltage, and
- wherein the pass voltage, applied to the remaining unselected word lines, increases stepwise by a lower second step voltage the farther the unselected world line is from the selected word line.

* * * * *